United States Patent [19]
Pastorello

[11] Patent Number: 5,923,273
[45] Date of Patent: Jul. 13, 1999

[54] REDUCED POWER FIR FILTER

[75] Inventor: Douglas F. Pastorello, Hudson, N.H.

[73] Assignee: Crystal Semiconductor Corporation, Austin, Tex.

[21] Appl. No.: 08/751,708

[22] Filed: Nov. 18, 1996

[51] Int. Cl.[6] .................................................. H03M 3/00
[52] U.S. Cl. ........................... 341/77; 341/143; 364/707
[58] Field of Search ................... 341/77, 143; 364/707, 364/724.1, 724.011, 724.04

[56] References Cited

U.S. PATENT DOCUMENTS

| | | | |
|---|---|---|---|
| 4,746,899 | 5/1988 | Swanson et al. | 340/347 |
| 4,766,562 | 8/1988 | Vary | 364/724 |
| 4,800,529 | 1/1989 | Ueno | 365/189 |
| 4,843,581 | 6/1989 | Cupo et al. | 364/724.01 |
| 4,943,807 | 7/1990 | Early et al. . | |
| 4,943,870 | 7/1990 | Sugishima | 358/451 |
| 4,982,355 | 1/1991 | Nishimura et al. | 364/758 |
| 5,101,369 | 3/1992 | Torii et al. | 364/724.11 |
| 5,157,395 | 10/1992 | Signore et al. | 341/143 |
| 5,181,033 | 1/1993 | Yassa et al. | 341/143 |
| 5,191,547 | 3/1993 | Kawamoto et al. | 364/724.1 |
| 5,200,912 | 4/1993 | Ashgar et al. | 364/707 |
| 5,220,327 | 6/1993 | Abbiate et al. . | |
| 5,294,928 | 3/1994 | Cooper et al. | 341/142 |
| 5,329,553 | 7/1994 | Abbiate et al. . | |
| 5,333,119 | 7/1994 | Raatz et al. | 364/760 |
| 5,363,101 | 11/1994 | Ueki . | |
| 5,410,310 | 4/1995 | Molnar . | |
| 5,423,047 | 6/1995 | Leak | 395/750 |
| 5,436,859 | 7/1995 | Lunner et al. | 364/724.16 |
| 5,541,864 | 7/1996 | Van Bavel et al. | 364/724.1 |

FOREIGN PATENT DOCUMENTS

| | | | |
|---|---|---|---|
| 05122716 | 5/1993 | Japan | H04N 9/64 |

OTHER PUBLICATIONS

Signore, et al., "A Monolithic 20–b Delta–Sigma A/D Converter," *IEEE Journal of Solid–State Circuits*, vol. 25, No. 6, pp. 1311–1317 (Dec. 1990).

Oppenheim, et al., "Digital Signal Processing," pp. 255–267 (1975).

D. Pearson and K. K. Parhi, "Low–Power FIR Digital Architectures," *Proc. of the 1995 IEEE Int. Symp. on Circuits and Systems*, pp. 231–234, (May 1995).

Oppenheim and Schafer, "Digital Signal Processing," *Prentice Hall*, Englewood Cliffs, NJ (1975).

*Primary Examiner*—Brian K. Young
*Assistant Examiner*—Jason L. W. Host
*Attorney, Agent, or Firm*—Richard D. Egan; J. P. Violette

[57] ABSTRACT

A reduced power FIR filter may be utilized as the digital decimation filter for a delta sigma ADC. The FIR filter utilizes a serial bit stream which is part of the control path of the filter. Thus, operations of the circuitry which comprises the filter may be controlled depending upon the data presented at the output of the delta sigma modulator. In particular, filter operations may be enabled only for a given digital state, for example, a digital 1 state. Thus, the filter operations may be enabled only for typically half of the bits from the serial bit stream and the power usage of the digital filter is significantly reduced.

39 Claims, 5 Drawing Sheets

REDUCED POWER FIR FILTER

FIELD OF THE INVENTION

The present invention relates to FIR filters, and more particularly to reduced power FIR filters for use in analog-to-digital converters.

BACKGROUND OF THE INVENTION

Oversampling analog-to-digital converters (ADC) generally consists of two parts, an analog modulator and a digital filter. The first part, the analog modulator, receives an analog signal and produces a serial data stream having a bit rate which is much greater than the Nyquist sampling frequency. The quantization noise of the analog modulator is shaped to minimize the noise in the passband of interest, at the expense of higher noise outside of this passband. This is as opposed to distributing the noise evenly between DC and the modulator sampling frequency. The digital filter portion of the ADC is operable to filter and decimate the modulator output to a lower frequency, higher resolution digital representation of the analog input. Since the modulator quantization noise is shaped, the digital filter must filter this out-of-band quantization noise and reduce the output word frequency. Decimation is a well-known technique that is utilized in most oversampling ADCs.

In a delta-sigma (also called sigma-delta) ADC, delta-sigma modulation techniques are utilized by the analog modulator. Delta-sigma ADC's are known in the art as shown, for example, in U.S. Pat. Nos. 4,746,899, 4,943,807 and 5,157,395, the disclosures of which are expressly incorporated herein by reference.

Conventional digital filters in ADCs utilize some form of digital signal processor utilizing either single or multiple stages of digital filtering. The digital filtering techniques typically utilize a finite impulse response (FIR) filter topology which generally requires a multiplier, an accumulator and stored filter coefficients that define the transfer function of the filter. The data is processed with the multiplier and accumulator utilizing the stored filter coefficients. Each set of filter coefficients is designed to provide a specific decimation rate and filter transfer function. Through decimation, the sampling rate of the signal from the delta sigma modulator is converted to a lower rate.

As integrated circuit densities increase, it is generally desirable to lessen the power requirements of any given portion of the circuitry on an integrated circuit. For a delta sigma ADC, a major part of the power requirements of the digital filter may be the power utilized to access the filter coefficients which are typically stored in a coefficient ROM. Thus, it would be desirable to lessen the power requirements of the digital filter circuitry of an ADC, and more particularly lessen the power utilized to access the coefficient ROM.

SUMMARY OF THE INVENTION

The present invention provides a reduced power FIR filter. The reduced power FIR filter may be utilized as the digital decimation filter for a delta sigma ADC. The FIR filter utilizes a serial bit stream which is part of the control path of the filter. Thus, operations of the circuitry which comprises the filter may be controlled depending upon the data presented at the output of the delta sigma modulator. In particular, filter operations may be enabled only for a given digital state, for example, a digital 1 state. Thus, the filter operations may be enabled only for typically half of the bits from the serial bit stream and the power usage of the digital filter is significantly reduced.

In one embodiment, the present invention includes a method for operating an analog-to-digital converter, including the steps of providing a digital filter within the analog-to-digital converter, providing a digital data stream to the filter and selectively disabling or selectively enabling at least a portion of the digital filter for at least some occurrences of a pre-determined condition of the digital data. The selective disabling or enabling may occur for each occurrence of the pre-determined condition. The pre-determined condition may be a digital logic state, including the digital 0 state or the digital 1 state. The digital filter may include a memory storage device, such a coefficient ROM or an accumulator, both of which may be disabled or enabled during the selective disabling or enabling step.

In another embodiment, the present invention includes a method for operating an analog-to-digital converter, including the steps providing a digital filter which has a coefficient ROM and an accumulator, providing an input serial digital data stream to the filter, wherein the data stream is a serial stream of 0s and 1s digital logic values and disabling or enabling the coefficient ROM and the accumulator in response to detecting a pre-determined one of the digital logic values.

In yet another embodiment of the present invention, a method of reducing the power consumption of an analog-to-digital converter is provided. The method may include providing a digital data stream to the digital filter, wherein the digital data is a function of an analog voltage or current level provided to the converter and selectively operating at least a portion of the digital filter in response to a condition of the digital data stream. The selective operation may include enabling or disabling a portion of the digital filter for a portion of a period in which the digital data stream is provided to the filter. The condition may be a pre-determined digital value and a portion of the filter may be disabled or enable for occurrences of the condition. Furthermore, the filter may include at least one data storage structure which may be a filter coefficient storage device or a register.

In still another embodiment of the present invention, a method for reducing the power consumption of a digital filter that filters an input digital data stream and provides a filter output is provided. The method may include providing a data signal path of the filter, wherein the data signal path has a plurality of circuits and a digital filter output. Furthermore, the method includes providing a control signal path of the filter, wherein the control signal path provides control signals for operating at least a portion of the data signal path circuits. Finally, the method may include providing the input digital data stream to the control signal path of the filter. In addition, this method may further include selectively disabling or enabling at least one of the circuits in the data signal path with the control signals. The circuits within the data path may include a filter coefficient storage device. Furthermore, in one alternative embodiment, the input digital data stream may be provided only to the control signal path.

The embodiments of the present invention also include a digital filter for an analog-to-digital converter. The digital filter may comprise a serial data stream input that receives as an input data to be filtered by the digital filter, a control signal path which has as an input the serial data steam input, a data signal path that has an output for providing a filtered output of the digital filter and control signals that are provided from the control signal path to the data signal path such that said control signals selectively enable at least a portion of the data signal path as a function of the condition of the serial data. In one embodiment, the serial data is only provided to the control signal path. The data signal path may include a filter coefficient storage device such as a filter coefficient ROM. The data signal path may also comprise a register such as an accumulator register.

In yet another digital filter of the present invention, there is provided a filter having an input which receives a data input stream to the digital filter, at least one enabled control signal that may be a function of the data at the data input stream, and a plurality of filter circuit components within the digital filter wherein at least one of the circuit components is connected to the enabled control signal such that at least one circuit component may be enabled or disabled as a function of the data at the data input stream.

Finally, the present invention may include a low power analog-to-digital converter digital filter having a controller, a serial bit stream input connected to the controller, a coefficient ROM which receives enable and coefficient address signals from the controller wherein the enabled signal is the function of the input data provided to the input, and a storage device coupled to the coefficient ROM wherein the storage device has a multi-bit output. The storage device may be an accumulator register connected to the enabled signal. Furthermore, the enabled signal may selectively enable or disable the coefficient ROM or the accumulator register as a function of whether the input data is a logical one or a logical zero.

DETAILED DESCRIPTION

Figure 1:
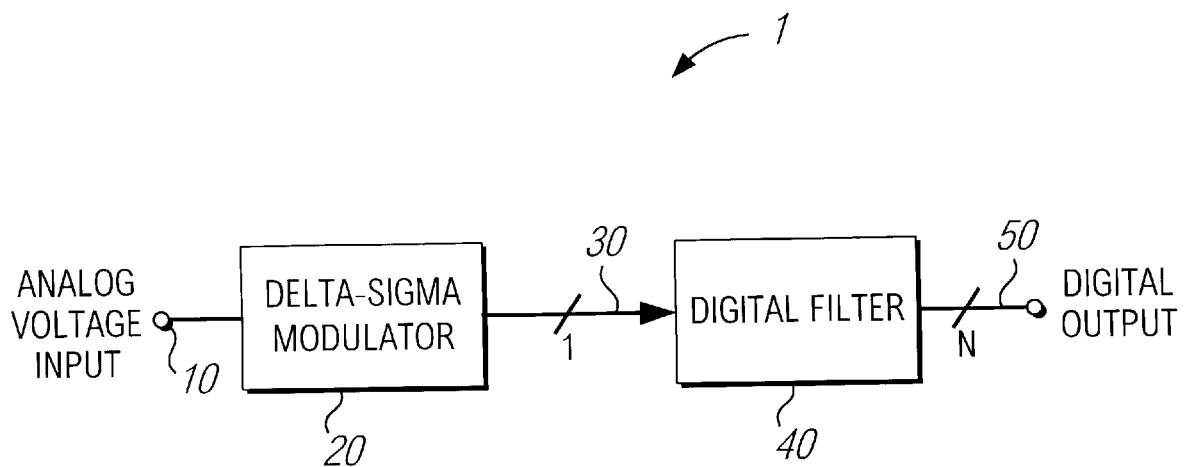
FIG. 1 is a block diagram of a conventional delta sigma ADC.

FIG. 1 illustrates a block diagram of a delta-sigma ADC. As shown in FIG. 1, a delta-sigma ADC I may include an analog voltage input 10. The analog voltage is provided to a delta-sigma modulator 20 which converts the analog input into digital data. The delta-sigma modulator 20 provides an output 30, which is a digital serial bit stream. The data on output 30 is an over sampled serial bit stream that has a "1"s density proportional to the voltage at the analog voltage input 10. The serial bit stream on output 30 is then provided to the digital filter 40. The digital filter 40 may be an FIR filter which operates to decimate the sampling frequency to a frequency lower than that at which the serial bit stream on line 30 is provided. The digital filter 40 converts the serial bit stream 30 into an N-bit word, and reduces the quantization noise introduced by the modulator.

Figure 2:
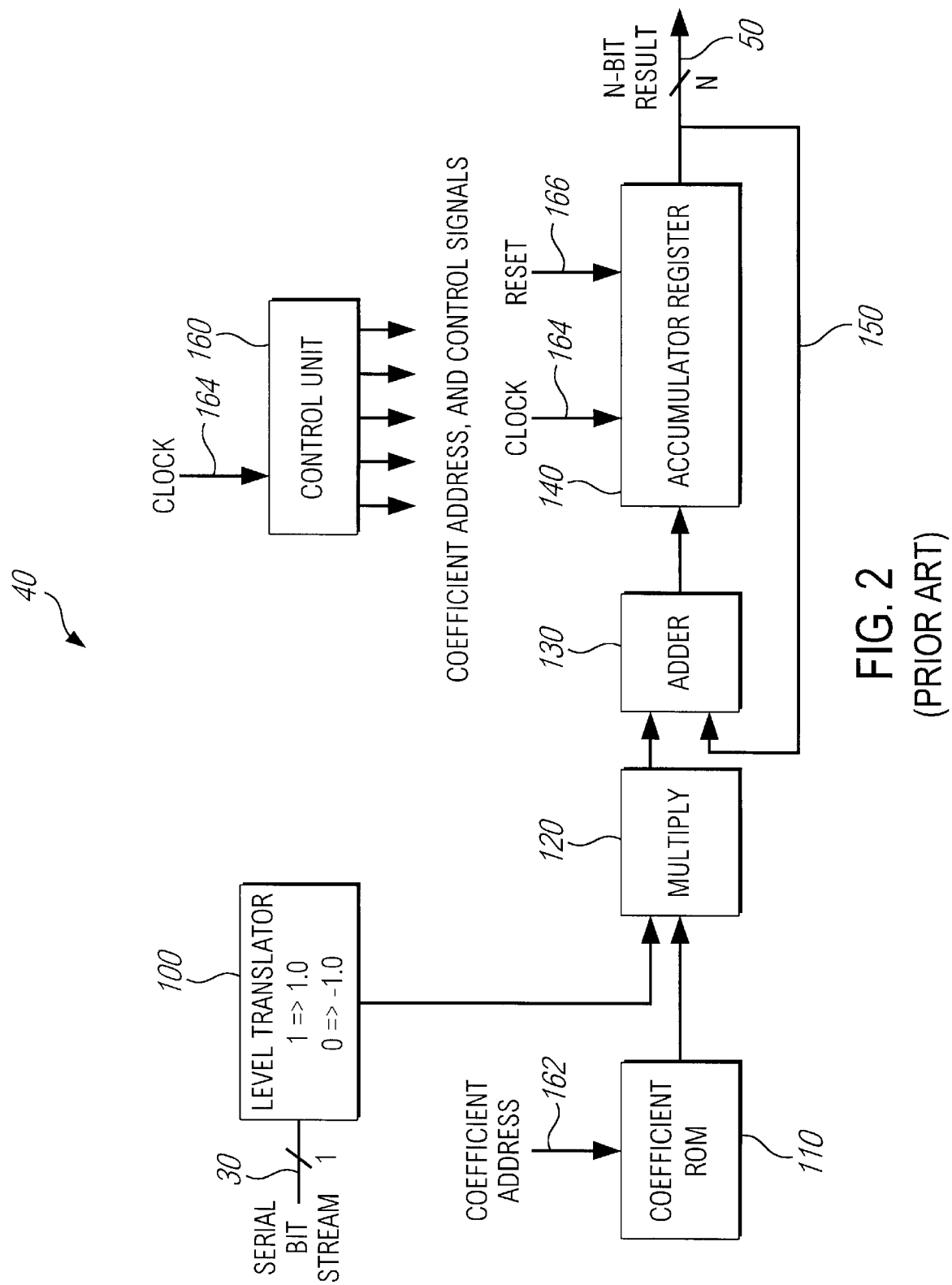
FIG. 2 is a block diagram of a conventional digital filter for use in a delta sigma ADC.

FIG. 2 illustrates a digital filter 40 according to the prior art. As shown in FIG. 2, the serial bit stream 30 is provided to a level translator 100. The level translator 100 converts the digital data such that a logical "1" is represented by 1.0 whereas a logical "0" is represented by −1.0. The output of the level translator 100 is provided to a multiplier 120. The multiplier 120 has another input which receives filter coefficients that are stored in the coefficient ROM 110. Within the multiplier 120, the output of the level translator is multiplied by the filter coefficient which is stored in the coefficient ROM at the coefficient address presently being pointed to by the coefficient address line 162. The output of the multiplier 120 is then provided to an adder 130. The adder 130 provides an output to an accumulator register 140. The output of the accumulator register is also provided to the adder 130 through feedback line 150. The output of the accumulator register 140 and the multiplier 120 are therefore added within the adder 130. Though shown as separate functional blocks, it will be recognized that the level translator 100, multiplier 120 and adder 130 may typically be implemented within one add/subtract circuit. N bits of the accumulator register 140 are then provided in parallel as the N bit digital output 50. The control unit 160 is utilized to provide control signals such as coefficient addresses, clock signals, and reset signals. The control unit receives a clock signal 164. The control unit 160 sequences through the coefficient addressees provided to the coefficient ROM by the coefficient address line 162. The control unit also provides a reset signal on the reset signal line 166. The accumulator register 140 also receives a reset signal that initializes the accumulator to "0" at the beginning of each convolution to be performed. The control unit also operates to provide control signals which will indicate when a conversion operation is completed. Clock signals are provided to the accumulator on the clock signal line 164.

Thus, as shown in FIG. 2, the serial bit stream 30 of the prior art is provided as part of the data path. This data is first provided to the level translator 100 for translation and then provided to the multiplier so that the sign of the filter coefficients may be changed based upon the logical value of the data within the serial bit stream.

Figure 3:
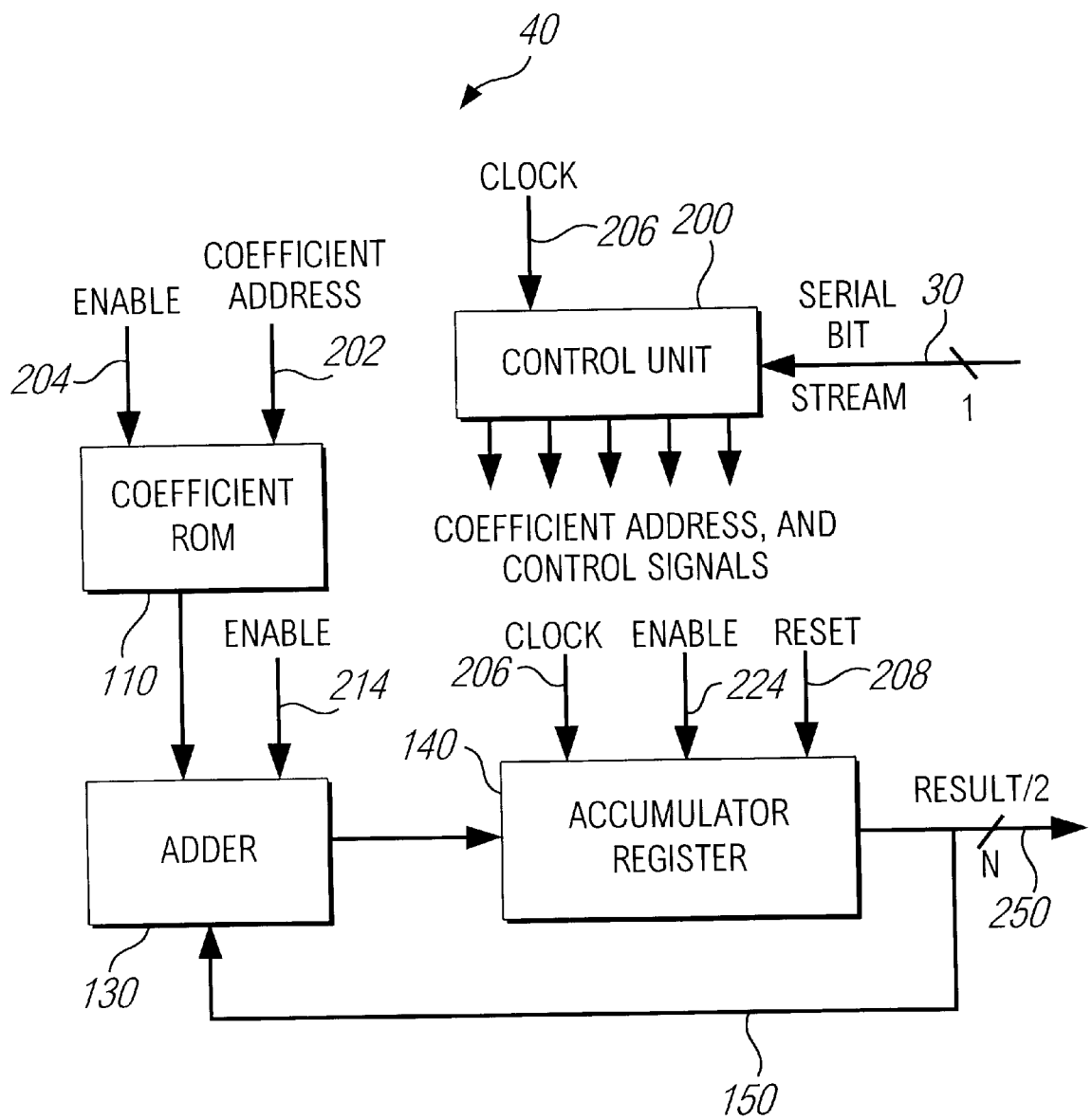
FIG. 3 is a block diagram of a FIR digital filter according to the present invention.

FIG. 3 illustrates a digital decimation filter 40 according to the present invention. As shown in FIG. 3, the serial bit stream 30 and a clock signal 206 are provided to the control unit 200. The control unit 200 provides control signals such as coefficient addresses, enable signals and reset signals. The control unit may be a finite state machine; however, it will be recognized that the other control logic, such as microcontrollers, etc. could be utilized. The filter coefficients stored in the coefficient ROM 110 are sequenced in accordance with the coefficient address on the coefficient address line 202. An enable signal 204 enables the coefficient ROM 110. The filter coefficients, which are an output of the coefficient ROM 110, are provided to an adder 130 which adds the filter coefficient and the output of the accumulator register 140. The output of the adder 130 is input to the accumulator register 140 and an N-bit digital output 250 is provided as the output of the accumulator register.

Figure 6:
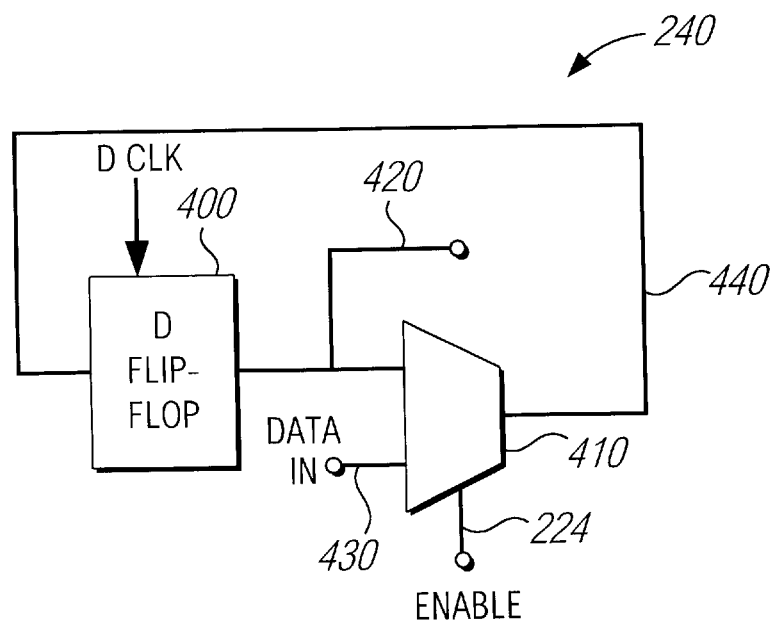
FIG. 6 is an example of a schematic for the bit slice of an accumulator register.

FIG. 6 is a schematic diagram of one type of register which may be utilized for the accumulator register 240. Shown in FIG. 6 is a single bit slice for the accumulator register. The bit slice may be repeated multiple times to create the actual accumulator (for example 29 times in the embodiment discussed below). The accumulator register has a series of D flip flops, such as D flip flop 400 which has an input 440 and an output 420. As discussed below, the accumulator register may have an enable function which, in the representative embodiment shown, may be implemented by the recirculating data from the flip flop. In particular, the input data for a bit of the accumulator may be provided on line 430. Line 430 and D flip flop output line 420 are provided to a multiplexer 410 which receives the enable signal 224 from the control unit 200. Many other types of registers may be utilized and the accumulator register 240 shown here is merely illustrated.

Thus, in the present invention, the serial bit stream 30 is part of the control path as opposed to the data path. The control unit 200 operates such that the control signals are dependent upon the data at the serial bit stream 30. In particular, filter operations are enabled only when there is a logical "1" present at the beginning of a filter step. A logical "0", however, causes no operation. Thus, enable signals 204, 214 and 224 are provided from the control unit so as to enable their associated circuitry when a "1" is present at the serial bit stream 30. As with the prior art, the control unit 200 also sequences through the filter coefficients by providing a sequence of coefficient addresses 202. The filter coefficient addresses are incremented independent of the state of the serial bit stream. Thus, for each bit of the serial bit stream the address will be incremented, however, for some of the addresses data may not be provided from the coefficient ROM since the ROM may be disabled.

The control unit 200 also provides the reset signal 208 which is utilized to reset the accumulator register 140 at the beginning of each convolution. The initial value to which the accumulator is reset is dependent upon the filter coefficients. In particular, the value may be the inverse of the digital filters offset which may be selected to be approximately one-half the sum of the filter coefficients. Alternatively other offset values or no offset at all may be utilized. The control unit 200 also signals when the operation has been completed. In particular, the start and end address of each coefficient set is pre-programmed into the control unit. The convolution is performed by sequencing through the coefficients. A "done" signal is then generated when the last coefficient is used.

The accumulator register 140 of the digital filter 40 of the present invention provides an output 250 which is one-half of the desired final filtered value. In particular, because no operation occurs for logical "0's" within the serial bit stream 30, a logical "0" results in the data being interpreted as 0.0 instead of being interpreted as a –1.0 (i.e., multiplying the filter coefficient to provide its inverse) as in the prior art. Thus, the loss in amplitude in the final filter value must be compensated for. Because the serial bit is not being translated from 1.0 to –1.0 and data values which in the prior art would be translated to –1.0 are left as 0, the final filtered value provided at the digital output 250 will be approximately one-half the desired value. To compensate for this loss in amplitude, a shift left operation can be performed before utilizing the digital value at output 250 within subsequent blocks of an ADC system.

Thus by utilizing a digital filter such a digital filter according to the present invention, power requirements for an FIR filter for use in a delta-sigma ADC may be lessened. In particular, since the power required to access the coefficient ROM may be a major part of the digital filter's power consumption, enabling the ROM, adder and accumulator only for logical "1" data may significantly decrease the average power consumed by the filter. In particular, in a typical application in which the "1" and "0" densities are approximately equal, the average power may be reduced by almost 50%. Furthermore, because the various circuit components are utilized for only approximately half the data, the average switching noise of the digital filter may also be reduced.

The principals of the present invention may be utilized to reduce power in many types of digital decimation filters utilized with delta-sigma ADC circuits. In one embodiment, the serial bit stream to the digital filter may be provided from a delta-sigma modulator operated with an oscillator frequency of 32.768 KHz. The digital filter may be programmable to provide a variety of 16 bit or 20 bit conversion word output rates. For example, eight output word rates of 3.76, 7.51, 15.02, 30.6, 60.01, 123.18, 168.9, and 202.27 hertz may be provided.

Figure 4:
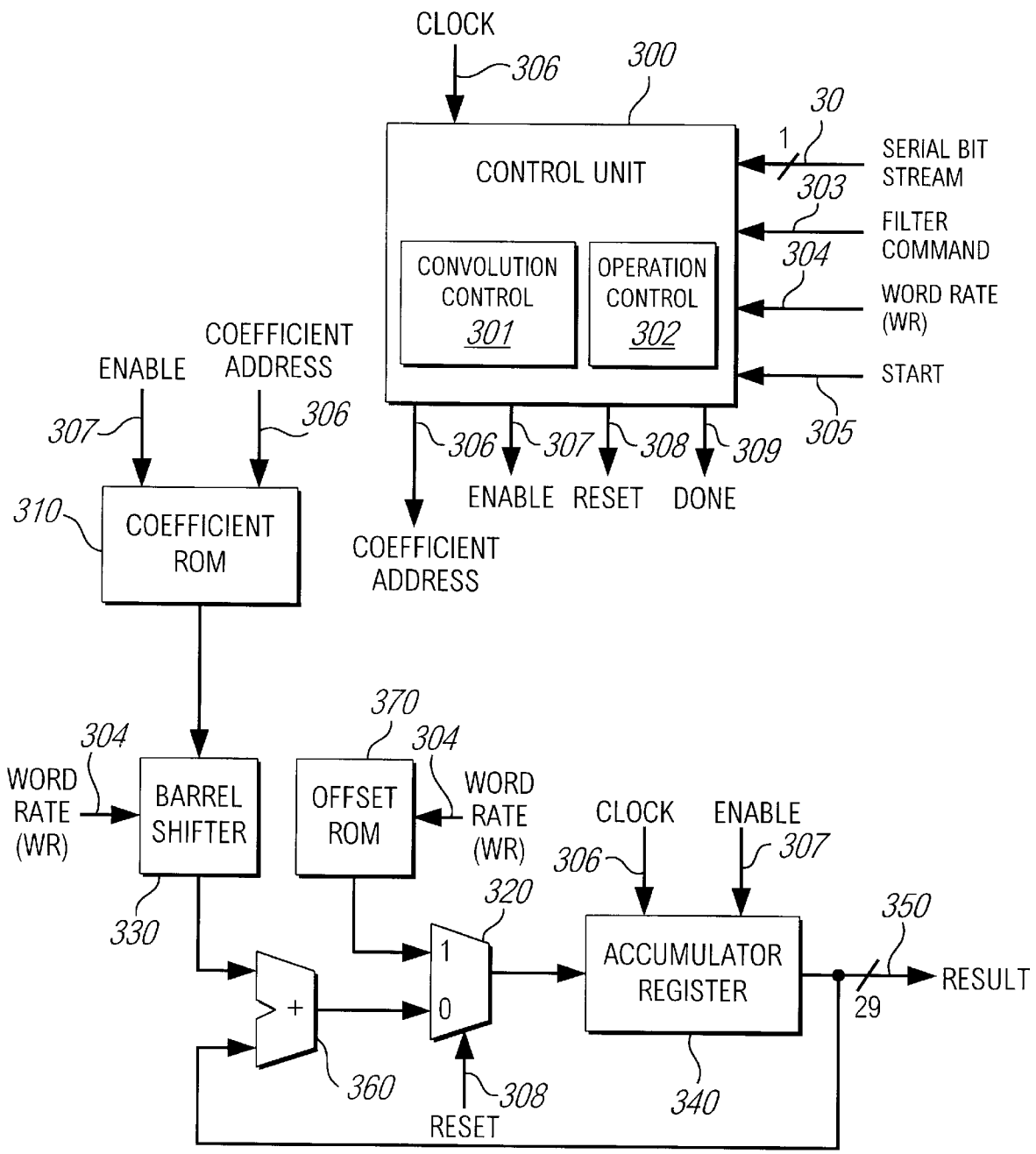
FIG. 4 is a block diagram of a FIR digital filter having multiple filter word rates according to the present invention.

FIG. 4 illustrates an example digital filter utilizing the present invention in which multiple word rates may be provided. Each of the eight word rates chosen has a corresponding set of filter coefficients stored within the coefficient ROM. Thus as a user selects a desired word rate, the control unit will provide a sequence of coefficient addresses which correspond to the set of appropriate filter coefficients for that chosen word rate. In an implementation such as shown in FIG. 4, the various word rates may be obtained by varying the length of the filter (i.e., the number of coefficients). A larger filter will result in a slower word rate and vice versa.

As shown in FIG. 4, a control unit 300 includes convolution control circuitry 301 and operation control circuitry 302. The control unit 300 receives as inputs the serial bit stream 30, a clock signal 306, a filter command 303, a word rate 304 and a start signal 305. Outputs of the control unit include the coefficient addresses 306, enable signal 307, the reset signal 308 and the conversion "DONE" signal 309.

Convolution control circuit 301 and operation control circuit 302 are provided within the control unit. The convolution control 301 functions to assert the reset signal 308 which is provided to the multiplexer 320 to reset the accumulator register at the beginning of each convolution, generate the sequence of coefficient ROM addresses based on the selected word rate, and generate the enable signal based on the serial bit stream. The operation control unit 302 may perform a variety ADC function commands such as offset calibration, gain calibration and continuous conversion, etc. For example, the operation control may select between a single convert and continuous convert mode so that one conversion could be performed and the ADC stopped or continuous conversions performed until the ADC stopped. The operation control may also perform internal offset calibration to compensate for the ADC's internal gain error and external offset calibration to compensate for the error in the whole system that the ADC is utilized within. Likewise internal and external gain functions may be performed by the operation control unit. Cyclic redundancy check (CRC) may also be performed by the operation control unit to test the integrity of various ROM values. Furthermore, the operation control unit 302 provides start and stop commands for the convolution control unit 301 and provides the DONE signal when the filter operation is completed. The present invention, however, may be used in an ADC whether or not the ADC utilizes any specific ADC function commands and the benefits of the present invention are independent of such commands.

The digital filter FIG. 4 also includes a coefficient ROM 310 which receives the enable signal 307 and the coefficient addresses 306. The output of the coefficient ROM 310 is provided to a barrel shifter 330 which also receives the word rate 304 as an input. The barrel shifter 330 scales the filter coefficients and provides the scaled filter coefficients to an adder 360. The output of the adder 360 is provided to a multiplexer 320 which also receives as an input an offset value from the offset ROM 370. The offset ROM 370 generates offsets for the various word rates. The desired offset depends upon the word rate, and thus, the offset ROM has a word rate input 304. The multiplexer 320 multiplexes either the offset value or the output of the adder 360. The output of the multiplexer 320 is provided to the accumulator register 340 which also receives as inputs clock signal 306 and the enable signal 307. The accumulator register may be 29 bits in length and may have a 29 bit output to output line 350.

At the beginning of each convolution, the accumulator register 340 is reset. In prior art filters, the reset value may be "0". With the filter of FIG. 4, the reset value is provided is approximately ½ the sum of the scaled filter coefficients. Alternatively other offset values or no offset at all may be utilized. In most cases, the offset value will be different for each filter. Thus, in order to support multiple filters, the offset ROM 370 and the multiplexer 320 are added to the circuit. The offset ROM 370 stores the offsets for each filter word rate (in this case ½ the sum of the scaled filter coefficients, though other offsets may be utilized). The word rate 304 is used to address the offset ROM so that the desired offset value may be provided as an output of the offset ROM. When the reset signal 308 is active, the accumulator is loaded with the value of the offset ROM 370 via the multiplexer 320.

As with the filter of FIG. 3, the coefficient ROM 310 in FIG. 4 stores the filter coefficients. In order to conserve coefficient ROM space, each filter coefficient as stored in the coefficient ROM may have less bits than desired and subsequently be scaled to the desired filter coefficient value. For example, as shown in FIG. 4, the coefficient ROM 310 may store 18 bit filter coefficients and the bit length of the coefficients may be the same irrespective of the word rate used. As a result, the raw sum of the coefficients is smaller for a short filter than the sum of a longer filter. This translates to a lower amplitude for the shorter filters.

In order to keep the signal amplitude consistent across all filters, the barrel shifter 330 scales the coefficients prior to providing the filter coefficients to the accumulator register 340. Thus the output of the shifter 330 is the scaled filter coefficients. The barrel shifter 330 dynamically shifts the input data and presents the results at the shifter output. The amount and direction of the shift are determined from the word rate input 304. The barrel shifter may be implemented without registers so that the time to compute the shifter output is not dependent on a system clock nor the size of the shift. As used herein, the shift is a shift left operation ("0" added at the LSB) and the size of the shift depends on the word rate. Thus, the bit width of the data output will be higher than the data input width. For example, the filter which has the slowest word rate may utilize no shift while each successively faster filter may utilize a single bit shift left as compared to the previous filter. The barrel shifter 330 may be implemented through a plurality multiplexers that are connected so as to allow the data shifting as discussed above. The word rate data may be decoded by the barrel shifter to provide enable signals to the appropriate multiplexers to achieve the desired shift.

The coefficient scaling of the barrel shifter 330 can also be used to compensate for the inherent 50% reduction in signal amplitude which was described above with regards to FIG. 3. Thus, as shown in FIG. 4 the output 350 is no longer one half scale but rather is the full scale output. The output 350 may be a 29 bit output. The bit length of the ADC may be selected by utilizing the desired most significant bits of the output 350. For example, for a 16 bit ADC only the 16 MSBs of the output 350 may be utilized while for a 20 bit ADC the 20 MSBs of the output 350 may be utilized.

Figure 5:
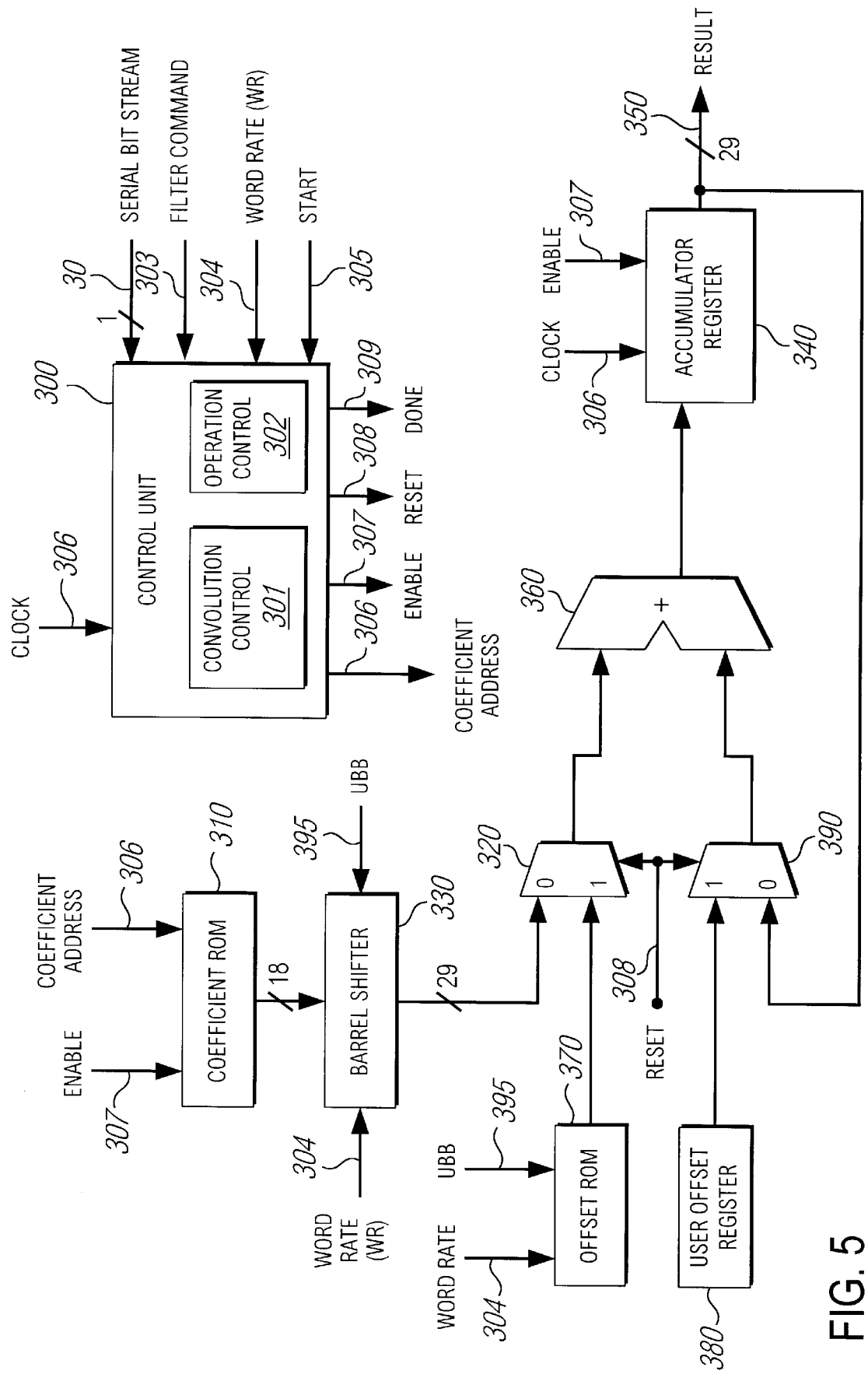
FIG. 5 is a block diagram of a FIR digital filter having multiple filter word rates according to the present invention.

Yet another embodiment of the present invention is a variation of the filter of FIG. 4 which is shown in FIG. 5. The filter of FIG. 5 provides the additional features of bipolar/unipolar mode selection and a user offset register. Most of the circuitry of FIG. 5 is similar that in FIG. 4; however, the offset ROM values of the offset ROM 370 are multiplexed with the barrel shifter 330 output through multiplexer 320 prior to the adder 360. Furthermore, a user offset register 380 is provided. As shown in FIG. 5 an 18 bit output is provided from the coefficient ROM 310 and a 29 bit output is provided from the barrel shifter 330. A user may calibrate the filter offset to compensate for the offset of the whole system in which the analog-to-digital converter is utilized by providing a calibration offset value to the offset register 380. The user offset register may contain a 24 bit 2's compliment offset that defaults to 0 if no user offset is provided. The output of the user offset register 380 is provided to a multiplexer 390 which in turn has an output connected to the adder 360. The reset signal 308 is provided to both mulitplexers 320 and 390 so that during reset the offset ROM 370 output and the user offset register 380 output are summed. Thus, the accumulator register is now initialized to the sum of the offset ROM value and the user offset. If no user offset is set by the user, than the user offset ROM stores a zero offset.

The filter of FIG. 5 also provides for both unipolar and bipolar ADC modes of operation. In bipolar mode the ADC modulator operates in ranges from −span/2 to +span/2 while in unipolar mode the operation varies from 0 to span (where "span" is the magnitude of the voltage range). In the circuit shown in FIG. 5, the filter coefficient scaling and the offset values vary depending upon the mode of operation. Thus, the UBB signal 395 is provided to the barrel shifter 330 and the offset ROM 370. In unipolar mode only half of the modulator's output range need be used; however, in order to maintain the complete output range at the filter output, the scaled filter coefficients need to be doubled. Thus, when the unipolar mode is selected by the UBB signal 395, the barrel shifter shifts the filter coefficients an additional bit. In addition since the scaled filter coefficients are now twice as large, the offset values in the offset ROM 370 need to be adjusted (if the offset is desired to be maintained at approximately half the sum of the scaled filter coefficients). The UBB signal 395 is therefore also provided to the offset ROM 370 so that the proper offset may be selected for unipolar or bipolar operation.

As discussed above with regard to the filter of FIG. 4, the filter of FIG. 5 may be utilized to provide multiple filters having varying word rates. The examples given herein provide for eight separate word rates, however, it will be recognized that other numbers of filters and specific word rates may be utilized. In the specific implementation described, each of the output word rates of 3.757, 7.512, 15.017, 30.062, 60.015, 123.188, 168.907, and 202.272 hertz corresponds to a separate set of filters coefficients. The filter coefficients for each word rate are shown herein in the Appendix. For example, as shown in the Appendix the filter coefficient for the address 8 of the output word rate of 3.757 is 23, the filter coefficient for the next address 24, etc. The scaling factor (the number of bits shifted in the barrel shifter) for each word rate and for each mode of operation are shown below in Table 1:

TABLE 1

| FILTER | BIOPOLAR SHIFT SIZE | UNIPOLAR SHIFT SIZE |
|---|---|---|
| 3.757 Hz | 0 | 1 |
| 7.512 Hz | 1 | 2 |
| 15.017 Hz | 2 | 3 |
| 30.062 Hz | 3 | 4 |
| 60.015 Hz | 4 | 5 |
| 123.188 Hz | 5 | 6 |
| 168.907 Hz | 6 | 7 |
| 202.272 Hz | 6 | 7 |

The offset values stored in the Offset ROM 370 for each word rate and for each mode of operation are shown below in Table 2:

TABLE 2

| FILTER | BIOPOLAR SHIFT SIZE | UNIPOLAR SHIFT SIZE |
|---|---|---|
| 3.757 Hz | 369098834 | 201326756 |
| 7.512 Hz | 369098708 | 201326504 |
| 15.017 Hz | 369098816 | 201326720 |
| 30.062 Hz | 369098672 | 201326432 |
| 60.015 Hz | 369100144 | 201329376 |
| 123.188 Hz | 369112640 | 201354368 |
| 168.907 Hz | 368991360 | 201111808 |
| 202.272 Hz | 368699648 | 200528384 |

As shown above, portions of the digital filter may be selectively enabled or disabled based on the occurrence of a predetermined condition of the serial data stream. In the example shown above, the predetermined condition of the serial data stream is a digital 1 or digital 0 state. However, it will be recognized that other conditions of the data stream may be utilized to trigger the selective enabling or disabling of portions of the digital filter. For example, it may be noted that the filter coefficients may be symmetrical about a mid point address. Thus, the filter coefficient addresses may be viewed as matching pairs. As seen for the output word rate 168.907 Hz, the 0 address has a value of 37, as does address 96 (the last address) and likewise the address after the 0 address has a value of 190, whereas the next to last address also has a value of 190, etc. In such a situation, the predetermined condition of the digital data which is utilized to enable or disable the portions of the digital filter, may be a result of the digital value of the matching pair of data bits for the symmetrical filter coefficients. In such a use, one could store the serial bit stream and then access the coefficient ROM only once per matching pair. In such a use, the coefficient ROM may be disabled when the matching pair of data bits is 01 or 10 and may be enabled when the matching pair of data bits is the logical state 11 or 00 or vice versa. Occurrences of other conditions of the serial data stream may also be utilized for the selective activation of portions of the filter as the invention herein is not limited to a specific data stream condition.

Further modifications and alternative embodiments of this invention will be apparent to those skilled in the art in view of this description. For example, the digital filter may be utilized in a number of ADC methods. Furthermore, the digital filter may also be utilized with any number of analog modulators including various delta-sigma modulation techniques. The filter operations may also be enabled and disabled based upon other patterns of data, rather then the preferred pattern of enabling the filter for all "1's" data and disabling the filter for all "0's" data. Accordingly, this description is to be construed as illustrative only and is for the purpose of teaching those skilled in the art the manner of carrying out the invention. It will be understood that the finds of the invention herein shown and described are to be taken as illustrative embodiments. For example, equivalent elements may be substituted for those illustrated as described herein and certain features of the invention may be utilized independently for the use of other features, all as would be apparent to one skilled in the art after having the benefit of this description of the invention.

APPENDIX

| Address | +0 | +1 | +2 | +3 | +4 | +5 | +6 | +7 |
|---|---|---|---|---|---|---|---|---|
| Output Word Rate = 3.757 Hz | | | | | | | | |
| 0 | 16 | 17 | 16 | 16 | 16 | 16 | 19 | 20 |
| 8 | 23 | 24 | 27 | 29 | 31 | 33 | 36 | 39 |
| 16 | 41 | 44 | 47 | 50 | 53 | 56 | 59 | 61 |
| 24 | 64 | 69 | 71 | 76 | 79 | 83 | 87 | 91 |
| 32 | 94 | 99 | 103 | 107 | 111 | 116 | 120 | 126 |
| 40 | 130 | 134 | 139 | 144 | 149 | 154 | 159 | 164 |
| 48 | 170 | 174 | 180 | 186 | 191 | 197 | 203 | 209 |
| 56 | 214 | 220 | 227 | 233 | 239 | 244 | 251 | 257 |
| 64 | 264 | 270 | 277 | 283 | 290 | 296 | 303 | 310 |
| 72 | 317 | 324 | 331 | 339 | 346 | 353 | 360 | 367 |
| 80 | 374 | 381 | 389 | 396 | 403 | 410 | 419 | 426 |
| 88 | 434 | 441 | 449 | 457 | 464 | 473 | 480 | 489 |
| 96 | 497 | 504 | 513 | 520 | 529 | 537 | 546 | 554 |
| 104 | 562 | 570 | 579 | 587 | 596 | 604 | 613 | 622 |
| 112 | 630 | 639 | 647 | 656 | 664 | 673 | 682 | 690 |
| 120 | 700 | 709 | 717 | 727 | 736 | 744 | 753 | 763 |
| 128 | 772 | 782 | 790 | 800 | 809 | 819 | 827 | 837 |
| 136 | 847 | 856 | 866 | 874 | 884 | 894 | 904 | 914 |
| 144 | 923 | 933 | 943 | 953 | 963 | 973 | 983 | 993 |
| 152 | 1003 | 1013 | 1023 | 1033 | 1043 | 1053 | 1063 | 1073 |
| 160 | 1084 | 1094 | 1104 | 1116 | 1126 | 1137 | 1147 | 1157 |
| 168 | 1169 | 1179 | 1190 | 1200 | 1212 | 1223 | 1234 | 1246 |
| 176 | 1256 | 1267 | 1279 | 1289 | 1300 | 1312 | 1323 | 1334 |
| 184 | 1346 | 1357 | 1369 | 1380 | 1393 | 1404 | 1416 | 1427 |
| 192 | 1440 | 1452 | 1464 | 1476 | 1489 | 1500 | 1513 | 1525 |

APPENDIX-continued

| Address | +0 | +1 | +2 | +3 | +4 | +5 | +6 | +7 |
|---|---|---|---|---|---|---|---|---|
| 200 | 1537 | 1550 | 1563 | 1575 | 1587 | 1600 | 1613 | 1626 |
| 208 | 1639 | 1652 | 1665 | 1677 | 1692 | 1705 | 1717 | 1732 |
| 216 | 1745 | 1759 | 1772 | 1786 | 1799 | 1813 | 1826 | 1840 |
| 224 | 1855 | 1869 | 1883 | 1897 | 1912 | 1926 | 1940 | 1955 |
| 232 | 1969 | 1983 | 1999 | 2013 | 2029 | 2043 | 2059 | 2073 |
| 240 | 2089 | 2103 | 2119 | 2135 | 2150 | 2166 | 2182 | 2197 |
| 248 | 2213 | 2230 | 2246 | 2262 | 2277 | 2293 | 2310 | 2326 |
| 256 | 2343 | 2359 | 2376 | 2393 | 2410 | 2427 | 2445 | 2462 |
| 264 | 2479 | 2496 | 2513 | 2532 | 2549 | 2566 | 2583 | 2602 |
| 272 | 2619 | 2638 | 2656 | 2673 | 2692 | 2710 | 2729 | 2748 |
| 280 | 2766 | 2785 | 2805 | 2823 | 2842 | 2862 | 2880 | 2900 |
| 288 | 2919 | 2939 | 2959 | 2978 | 2998 | 3018 | 3038 | 3058 |
| 296 | 3078 | 3098 | 3119 | 3139 | 3160 | 3180 | 3202 | 3222 |
| 304 | 3243 | 3263 | 3285 | 3306 | 3328 | 3349 | 3370 | 3392 |
| 312 | 3415 | 3436 | 3458 | 3480 | 3502 | 3525 | 3546 | 3569 |
| 320 | 3592 | 3615 | 3638 | 3661 | 3683 | 3706 | 3729 | 3752 |
| 328 | 3775 | 3799 | 3822 | 3846 | 3869 | 3893 | 3918 | 3941 |
| 336 | 3965 | 3989 | 4013 | 4038 | 4063 | 4088 | 4112 | 4136 |
| 344 | 4162 | 4186 | 4212 | 4236 | 4262 | 4288 | 4313 | 4339 |
| 352 | 4365 | 4391 | 4416 | 4443 | 4469 | 4495 | 4521 | 4548 |
| 360 | 4574 | 4601 | 4628 | 4654 | 4681 | 4708 | 4735 | 4762 |
| 368 | 4791 | 4818 | 4845 | 4872 | 4901 | 4928 | 4956 | 4984 |
| 376 | *5012 | 5041 | 5069 | 5098 | 5126 | 5155 | 5184 | 5212 |
| 384 | 5241 | 5269 | 5299 | 5328 | 5358 | 5386 | 5416 | 5446 |
| 392 | 5477 | 5507 | 5537 | 5567 | 5597 | 5627 | 5657 | 5688 |
| 400 | 5718 | 5749 | 5779 | 5811 | 5841 | 5872 | 5904 | 5935 |
| 408 | 5967 | 5998 | 6029 | 6061 | 6092 | 6125 | 6157 | 6189 |
| 416 | 6221 | 6254 | 6287 | 6318 | 6351 | 6384 | 6417 | 6449 |
| 424 | 6482 | 6515 | 6550 | 6582 | 6617 | 6650 | 6684 | 6717 |
| 432 | 6751 | 6785 | 6820 | 6854 | 6888 | 6922 | 6957 | 6991 |
| 440 | 7027 | 7061 | 7097 | 7131 | 7167 | 7201 | 7237 | 7272 |
| 448 | 7308 | 7344 | 7380 | 7415 | 7451 | 7487 | 7524 | 7560 |
| 456 | 7597 | 7633 | 7670 | 7707 | 7744 | 7781 | 7818 | 7855 |
| 464 | 7893 | 7930 | 7967 | 8004 | 8043 | 8080 | 8118 | 8155 |
| 472 | 8194 | 8233 | 8271 | 8310 | 8348 | 8387 | 8427 | 8466 |
| 480 | 8504 | 8544 | 8583 | 8623 | 8661 | 8701 | 8741 | 8781 |
| 488 | 8821 | 8861 | 8901 | 8941 | 8983 | 9023 | 9064 | 9104 |
| 496 | 9146 | 9186 | 9227 | 9268 | 9310 | 9351 | 9393 | 9434 |
| 504 | 9477 | 9519 | 9561 | 9603 | 9646 | 9689 | 9731 | 9773 |
| 512 | 9816 | 9859 | 9903 | 9946 | 9989 | 10033 | 10076 | 10120 |
| 520 | 10163 | 10207 | 10251 | 10296 | 10340 | 10384 | 10429 | 10473 |
| 528 | 10517 | 10563 | 10607 | 10653 | 10697 | 10743 | 10789 | 10834 |
| 536 | 10880 | 10926 | 10972 | 11017 | 11064 | 11110 | 11157 | 11203 |
| 544 | 11250 | 11297 | 11344 | 11392 | 11439 | 11486 | 11535 | 11582 |
| 552 | 11629 | 11677 | 11725 | 11773 | 11822 | 11870 | 11919 | 11967 |
| 560 | 12016 | 12065 | 12115 | 12163 | 12213 | 12262 | 12312 | 12362 |
| 568 | 12412 | 12462 | 12512 | 12562 | 12612 | 12663 | 12713 | 12765 |
| 576 | 12815 | 12866 | 12918 | 12969 | 13020 | 13072 | 13123 | 13175 |
| 584 | 13228 | 13279 | 13332 | 13383 | 13436 | 13489 | 13542 | 13595 |
| 592 | 13648 | 13702 | 13755 | 13809 | 13862 | 13916 | 13971 | 14023 |
| 600 | 14078 | 14132 | 14186 | 14241 | 14296 | 14351 | 14406 | 14461 |
| 608 | 14516 | 14572 | 14628 | 14684 | 14739 | 14795 | 14852 | 14908 |
| 616 | 14965 | 15021 | 15078 | 15135 | 15192 | 15249 | 15306 | 15364 |
| 624 | 15421 | 15479 | 15537 | 15595 | 15654 | 15712 | 15771 | 15829 |
| 632 | 15888 | 15947 | 16005 | 16065 | 16124 | 16184 | 16244 | 16302 |
| 640 | 16362 | 16422 | 16484 | 16544 | 16604 | 16665 | 16725 | 16787 |
| 648 | 16848 | 16910 | 16971 | 17032 | 17094 | 17155 | 17218 | 17280 |
| 656 | 17342 | 17404 | 17467 | 17530 | 17593 | 17655 | 17720 | 17783 |
| 664 | 17845 | 17910 | 17974 | 18037 | 18101 | 18165 | 18230 | 18294 |
| 672 | 18360 | 18424 | 18490 | 18554 | 18620 | 18686 | 18751 | 18817 |
| 680 | 18883 | 18948 | 19016 | 19081 | 19148 | 19214 | 19281 | 19348 |
| 688 | 19416 | 19483 | 19551 | 19619 | 19687 | 19754 | 19823 | 19890 |
| 696 | 19959 | 20027 | 20096 | 20166 | 20234 | 20304 | 20373 | 20443 |
| 704 | 20513 | 20583 | 20653 | 20723 | 20793 | 20863 | 20933 | 21004 |
| 712 | 21076 | 21147 | 21219 | 21290 | 21362 | 21433 | 21505 | 21577 |
| 720 | 21649 | 21722 | 21793 | 21866 | 21939 | 22012 | 22086 | 22159 |
| 728 | 22233 | 22306 | 22380 | 22455 | 22529 | 22603 | 22678 | 22752 |
| 736 | 22826 | 22902 | 22976 | 23052 | 23128 | 23203 | 23279 | 23355 |
| 744 | 23431 | 23508 | 23583 | 23661 | 23738 | 23815 | 23892 | 23969 |
| 752 | 24046 | 24123 | 24202 | 24279 | 24358 | 24435 | 24514 | 24592 |
| 760 | 24671 | 24749 | 24829 | 24908 | 24988 | 25066 | 25146 | 25226 |
| 768 | 25306 | 25387 | 25468 | 25548 | 25629 | 25709 | 25791 | 25872 |
| 776 | 25954 | 26035 | 26118 | 26199 | 26281 | 26364 | 26445 | 26528 |
| 784 | 26611 | 26694 | 26777 | 26861 | 26944 | 27028 | 27111 | 27195 |
| 792 | 27280 | 27364 | 27450 | 27534 | 27618 | 27704 | 27788 | 27874 |
| 800 | 27960 | 28045 | 28131 | 28217 | 28303 | 28390 | 28476 | 28563 |
| 808 | 28650 | 28737 | 28824 | 28911 | 29090 | 29087 | 29176 | 29263 |

APPENDIX-continued

| Address | +0 | +1 | +2 | +3 | +4 | +5 | +6 | +7 |
|---|---|---|---|---|---|---|---|---|
| 816 | 29351 | 29440 | 29529 | 29617 | 29707 | 29796 | 29886 | 29974 |
| 824 | 30064 | 30154 | 30244 | 30334 | 30424 | 30516 | 30606 | 30697 |
| 832 | 30789 | 30879 | 30970 | 31062 | 31154 | 31246 | 31339 | 31430 |
| 840 | 31523 | 31616 | 31709 | 31802 | 31895 | 31989 | 32082 | 32176 |
| 848 | 32270 | 32363 | 32458 | 32552 | 32648 | 32742 | 32838 | 32932 |
| 856 | 33028 | 33123 | 33219 | 33315 | 33411 | 33508 | 33603 | 33701 |
| 864 | 33798 | 33895 | 33992 | 34089 | 34186 | 34283 | 34382 | 34479 |
| 872 | 34578 | 34676 | 34775 | 34874 | 34972 | 35072 | 35171 | 35271 |
| 880 | 35371 | 35471 | 35571 | 35671 | 35771 | 35871 | 35972 | 36072 |
| 888 | 36174 | 36275 | 36377 | 36478 | 36581 | 36682 | 36785 | 36887 |
| 896 | 36990 | 37092 | 37195 | 37298 | 37401 | 37505 | 37608 | 37713 |
| 904 | 37817 | 37921 | 38025 | 38130 | 38234 | 38340 | 38444 | 38550 |
| 912 | 38654 | 38760 | 38866 | 38971 | 39078 | 39184 | 39291 | 39397 |
| 920 | 39504 | 39611 | 39719 | 39826 | 39934 | 40041 | 40150 | 40257 |
| 928 | 40366 | 40474 | 40583 | 40692 | 40802 | 40910 | 41020 | 41129 |
| 936 | 41239 | 41349 | 41459 | 41569 | 41680 | 41790 | 41902 | 42012 |
| 944 | 42123 | 42235 | 42346 | 42458 | 42570 | 42682 | 42795 | 42906 |
| 952 | 43019 | 43132 | 43245 | 43358 | 43472 | 43585 | 43699 | 43812 |
| 960 | 43926 | 44041 | 44155 | 44269 | 44384 | 44499 | 44614 | 44729 |
| 968 | 44845 | 44961 | 45076 | 45192 | 45308 | 45424 | 45541 | 45657 |
| 976 | 45774 | 45891 | 46008 | 46125 | 46244 | 46361 | 46480 | 46597 |
| 984 | 46715 | 46832 | 46951 | 47070 | 47190 | 47308 | 47428 | 47547 |
| 992 | 47667 | 47785 | 47905 | 48025 | 48147 | 48267 | 48388 | 48508 |
| 1000 | 48630 | 48750 | 48871 | 48993 | 49114 | 49236 | 49359 | 49480 |
| 1008 | 49603 | 49726 | 49849 | 49971 | 50094 | 50217 | 50340 | 50463 |
| 1016 | 50587 | 50710 | 50834 | 50959 | 51083 | 51207 | 51333 | 51457 |
| 1024 | 51582 | 51707 | 51832 | 51957 | 52083 | 52209 | 52336 | 52462 |
| 1032 | 52588 | 52715 | 52840 | 52968 | 53095 | 53222 | 53349 | 53476 |
| 1040 | 53603 | 53732 | 53859 | 53988 | 54115 | 54244 | 54372 | 54501 |
| 1048 | 54629 | 54758 | 54888 | 55016 | 55146 | 55275 | 55405 | 55535 |
| 1056 | 55665 | 55795 | 55927 | 56057 | 56188 | 56318 | 56450 | 56581 |
| 1064 | 56712 | 56844 | 56975 | 57107 | 57238 | 57371 | 57503 | 57635 |
| 1072 | 57768 | 57901 | 58034 | 58167 | 58300 | 58433 | 58566 | 58700 |
| 1080 | 58833 | 58967 | 59101 | 59236 | 59370 | 59504 | 59639 | 59773 |
| 1088 | 59909 | 60043 | 60179 | 60313 | 60449 | 60584 | 60720 | 60856 |
| 1096 | 60993 | 61129 | 61266 | 61402 | 61539 | 61675 | 61812 | 61949 |
| 1104 | 62086 | 62223 | 62360 | 62498 | 62636 | 62773 | 62912 | 63050 |
| 1112 | 63189 | 63328 | 63466 | 63605 | 63743 | 63882 | 64021 | 64161 |
| 1120 | 64299 | 64439 | 64579 | 64718 | 64858 | 64998 | 65138 | 65278 |
| 1128 | 65419 | 65559 | 65701 | 65841 | 65982 | 66122 | 66264 | 66405 |
| 1136 | 66547 | 66688 | 66831 | 66972 | 67114 | 67257 | 67398 | 67541 |
| 1144 | 67683 | 67825 | 67968 | 68111 | 68254 | 68397 | 68541 | 68684 |
| 1152 | 68827 | 68971 | 69114 | 69259 | 69403 | 69546 | 69690 | 69834 |
| 1160 | 69979 | 70123 | 70269 | 70413 | 70557 | 70703 | 70847 | 70993 |
| 1168 | 71139 | 71283 | 71429 | 71575 | 71720 | 71866 | 72013 | 72159 |
| 1176 | 72305 | 72452 | 72598 | 72745 | 72890 | 73038 | 73185 | 73331 |
| 1184 | 73478 | 73625 | 73772 | 73919 | 74068 | 74215 | 74364 | 74511 |
| 1192 | 74659 | 74806 | 74955 | 75102 | 75251 | 75399 | 75548 | 75697 |
| 1200 | 75845 | 75994 | 76144 | 76292 | 76441 | 76591 | 76740 | 76890 |
| 1208 | 77038 | 77188 | 77338 | 77487 | 77637 | 77787 | 77937 | 78087 |
| 1216 | 78238 | 78388 | 78538 | 78688 | 78840 | 78990 | 79141 | 79291 |
| 1224 | 79443 | 79594 | 79746 | 79896 | 80047 | 80199 | 80350 | 80502 |
| 1232 | 80653 | 80804 | 80957 | 81109 | 81260 | 81413 | 81565 | 81717 |
| 1240 | 81869 | 82022 | 82175 | 82328 | 82479 | 82632 | 82785 | 82938 |
| 1248 | 83091 | 83243 | 83396 | 83549 | 83702 | 83856 | 84009 | 84162 |
| 1256 | 84315 | 84469 | 84622 | 84776 | 84931 | 85084 | 85238 | 85391 |
| 1264 | 85545 | 85699 | 85854 | 86008 | 86162 | 86317 | 86471 | 86625 |
| 1272 | 86780 | 86935 | 87090 | 87244 | 87398 | 87553 | 87708 | 87863 |
| 1280 | 88018 | 88173 | 88328 | 88484 | 88638 | 88794 | 88948 | 89104 |
| 1288 | 89260 | 89414 | 89570 | 89726 | 89881 | 90037 | 90193 | 90349 |
| 1296 | 90504 | 90660 | 90816 | 90972 | 91129 | 91285 | 91440 | 91597 |
| 1304 | 91753 | 91910 | 92066 | 92222 | 92379 | 92535 | 92692 | 92848 |
| 1312 | 93005 | 93161 | 93318 | 93473 | 93631 | 93788 | 93943 | 94101 |
| 1320 | 94258 | 94415 | 94571 | 94728 | 94885 | 95041 | 95198 | 95355 |
| 1328 | 95512 | 95669 | 95827 | 95985 | 96142 | 96300 | 96457 | 96614 |
| 1336 | 96771 | 96928 | 97085 | 97243 | 97400 | 97558 | 97715 | 97873 |
| 1344 | 98030 | 98188 | 98346 | 98503 | 98660 | 98817 | 98976 | 99133 |
| 1352 | 99291 | 99449 | 99606 | 99764 | 99921 | 100080 | 100237 | 100396 |
| 1360 | 100553 | 100712 | 100869 | 101026 | 101185 | 101342 | 101500 | 101657 |
| 1368 | 101816 | 101973 | 102132 | 102289 | 102448 | 102606 | 102763 | 102922 |
| 1376 | 103079 | 103238 | 103395 | 103553 | 103711 | 103869 | 104026 | 104185 |
| 1384 | 104344 | 104501 | 104659 | 104816 | 104975 | 105132 | 105291 | 105448 |
| 1392 | 105607 | 105764 | 105922 | 106081 | 106238 | 106397 | 106554 | 106712 |
| 1400 | 106870 | 107028 | 107185 | 107344 | 107501 | 107660 | 107817 | 107976 |
| 1408 | 108133 | 108291 | 108448 | 108607 | 108764 | 108921 | 109079 | 109237 |
| 1416 | 109394 | 109553 | 109710 | 109869 | 110026 | 110183 | 110340 | 110499 |
| 1424 | 110656 | 110813 | 110970 | 111127 | 111286 | 111443 | 111600 | 111757 |

APPENDIX-continued

| Address | +0 | +1 | +2 | +3 | +4 | +5 | +6 | +7 |
|---|---|---|---|---|---|---|---|---|
| 1432 | 111915 | 112072 | 112230 | 112388 | 112545 | 112702 | 112859 | 113016 |
| 1440 | 113173 | 113331 | 113488 | 113645 | 113802 | 113959 | 114116 | 114274 |
| 1448 | 114429 | 114586 | 114744 | 114899 | 115057 | 115214 | 115371 | 115527 |
| 1456 | 115684 | 115839 | 115997 | 116152 | 116310 | 116465 | 116622 | 116778 |
| 1464 | 116935 | 117091 | 117247 | 117403 | 117560 | 117715 | 117871 | 118028 |
| 1472 | 118184 | 118340 | 118496 | 118651 | 118807 | 118963 | 119119 | 119274 |
| 1480 | 119430 | 119586 | 119740 | 119896 | 120052 | 120207 | 120362 | 120517 |
| 1488 | 120672 | 120827 | 120982 | 121137 | 121292 | 121447 | 121602 | 121757 |
| 1496 | 121912 | 122066 | 122220 | 122376 | 122530 | 122685 | 122839 | 122993 |
| 1504 | 123148 | 123302 | 123455 | 123609 | 123763 | 123916 | 124071 | 124225 |
| 1512 | 124379 | 124532 | 124686 | 124839 | 124994 | 125147 | 125299 | 125452 |
| 1520 | 125607 | 125759 | 125912 | 126065 | 126218 | 126371 | 126524 | 126677 |
| 1528 | 126830 | 126983 | 127134 | 127287 | 127438 | 127591 | 127743 | 127896 |
| 1536 | 128047 | 128200 | 128351 | 128503 | 128654 | 128806 | 128957 | 129109 |
| 1544 | 129260 | 129411 | 129563 | 129713 | 129864 | 130016 | 130167 | 130317 |
| 1552 | 130469 | 130619 | 130769 | 130919 | 131070 | 131220 | 131370 | 131520 |
| 1560 | 131670 | 131820 | 131970 | 132120 | 132270 | 132419 | 132569 | 132718 |
| 1568 | 132868 | 133016 | 133166 | 133315 | 133463 | 133612 | 133761 | 133909 |
| 1576 | 134058 | 134206 | 134355 | 134504 | 134651 | 134799 | 134947 | 135095 |
| 1584 | 135242 | 135391 | 135538 | 135685 | 135832 | 135980 | 136127 | 136274 |
| 1592 | 136421 | 136567 | 136714 | 136860 | 137007 | 137153 | 137300 | 137445 |
| 1600 | 137591 | 137737 | 137883 | 138028 | 138174 | 138320 | 138466 | 138610 |
| 1608 | 138756 | 138900 | 139046 | 139190 | 139334 | 139480 | 139624 | 139769 |
| 1616 | 139913 | 140057 | 140200 | 140344 | 140487 | 140632 | 140775 | 140919 |
| 1624 | 141062 | 141205 | 141347 | 141490 | 141633 | 141776 | 141918 | 142060 |
| 1632 | 142203 | 142345 | 142488 | 142629 | 142771 | 142912 | 143053 | 143195 |
| 1640 | 143336 | 143478 | 143618 | 143759 | 143899 | 144041 | 144181 | 144321 |
| 1648 | 144461 | 144601 | 144741 | 144881 | 145021 | 145159 | 145299 | 145438 |
| 1656 | 145578 | 145717 | 145855 | 145994 | 146132 | 146271 | 146410 | 146547 |
| 1664 | 146685 | 146823 | 146961 | 147098 | 147235 | 147373 | 147510 | 147647 |
| 1672 | 147784 | 147920 | 148057 | 148193 | 148330 | 148466 | 148601 | 148737 |
| 1680 | 148873 | 149009 | 149144 | 149279 | 149414 | 149549 | 149683 | 149819 |
| 1688 | 149953 | 150087 | 150220 | 150354 | 150489 | 150622 | 150756 | 150889 |
| 1696 | 151022 | 151155 | 151287 | 151420 | 151553 | 151685 | 151818 | 151949 |
| 1704 | 152082 | 152213 | 152345 | 152476 | 152608 | 152738 | 152869 | 152999 |
| 1712 | 153131 | 153261 | 153391 | 153521 | 153651 | 153781 | 153911 | 154039 |
| 1720 | 154169 | 154298 | 154426 | 154555 | 154684 | 154812 | 154941 | 155068 |
| 1728 | 155197 | 155324 | 155451 | 155578 | 155705 | 155832 | 155960 | 156085 |
| 1736 | 156212 | 156338 | 156465 | 156591 | 156717 | 156843 | 156967 | 157093 |
| 1744 | 157217 | 157343 | 157467 | 157591 | 157716 | 157840 | 157963 | 158087 |
| 1752 | 158210 | 158333 | 158456 | 158578 | 158701 | 158824 | 158947 | 159069 |
| 1760 | 159191 | 159313 | 159434 | 159556 | 159677 | 159799 | 159919 | 160040 |
| 1768 | 160160 | 160280 | 160400 | 160520 | 160639 | 160759 | 160877 | 160997 |
| 1776 | 161116 | 161235 | 161353 | 161472 | 161589 | 161708 | 161825 | 161942 |
| 1784 | 162059 | 162176 | 162293 | 162409 | 162526 | 162642 | 162758 | 162873 |
| 1792 | 162989 | 163105 | 163221 | 163335 | 163449 | 163563 | 163678 | 163792 |
| 1800 | 163906 | 164019 | 164134 | 164246 | 164359 | 164472 | 164585 | 164698 |
| 1808 | 164809 | 164922 | 165034 | 165145 | 165257 | 165368 | 165478 | 165589 |
| 1816 | 165700 | 165810 | 165920 | 166030 | 166138 | 166248 | 166357 | 166465 |
| 1824 | 166574 | 166683 | 166791 | 166898 | 167005 | 167114 | 167221 | 167328 |
| 1832 | 167434 | 167541 | 167647 | 167754 | 167860 | 167966 | 168070 | 168176 |
| 1840 | 168280 | 168386 | 168490 | 168594 | 168699 | 168801 | 168906 | 169009 |
| 1848 | 169111 | 169214 | 169317 | 169419 | 169521 | 169623 | 169724 | 169826 |
| 1856 | 169927 | 170027 | 170129 | 170229 | 170329 | 170429 | 170529 | 170627 |
| 1864 | 170727 | 170826 | 170925 | 171023 | 171122 | 171219 | 171317 | 171415 |
| 1872 | 171512 | 171609 | 171705 | 171802 | 171898 | 171993 | 172089 | 172185 |
| 1880 | 172280 | 172375 | 172469 | 172563 | 172658 | 172752 | 172845 | 172939 |
| 1888 | 173032 | 173125 | 173218 | 173309 | 173402 | 173493 | 173585 | 173676 |
| 1896 | 173766 | 173858 | 173948 | 174038 | 174128 | 174218 | 174308 | 174396 |
| 1904 | 174485 | 174574 | 174662 | 174751 | 174838 | 174925 | 175012 | 175099 |
| 1912 | 175187 | 175272 | 175359 | 175445 | 175531 | 175615 | 175701 | 175785 |
| 1920 | 175870 | 175954 | 176038 | 176122 | 176205 | 176288 | 176371 | 176454 |
| 1928 | 176537 | 176618 | 176700 | 176781 | 176863 | 176944 | 177024 | 177104 |
| 1936 | 177184 | 177264 | 177344 | 177423 | 177501 | 177580 | 177658 | 177737 |
| 1944 | 177814 | 177891 | 177968 | 178046 | 178123 | 178198 | 178274 | 178350 |
| 1952 | 178426 | 178501 | 178576 | 178651 | 178726 | 178799 | 178873 | 178946 |
| 1960 | 179019 | 179091 | 179164 | 179236 | 179309 | 179380 | 179451 | 179523 |
| 1968 | 179593 | 179664 | 179734 | 179804 | 179873 | 179943 | 180012 | 180080 |
| 1976 | 180149 | 180216 | 180284 | 180352 | 180419 | 180484 | 180552 | 180617 |
| 1984 | 180683 | 180749 | 180815 | 180879 | 180945 | 181009 | 181073 | 181136 |
| 1992 | 181200 | 181263 | 181326 | 181389 | 181450 | 181512 | 181573 | 181635 |
| 2000 | 181696 | 181756 | 181816 | 181876 | 181936 | 181996 | 182055 | 182113 |
| 2008 | 182172 | 182230 | 182288 | 182346 | 182403 | 182459 | 182516 | 182572 |
| 2016 | 182628 | 182683 | 182739 | 182793 | 182849 | 182903 | 182956 | 183011 |
| 2024 | 183063 | 183116 | 183169 | 183222 | 183273 | 183325 | 183376 | 183428 |
| 2032 | 183479 | 183529 | 183579 | 183629 | 183679 | 183728 | 183776 | 183825 |
| 2040 | 183874 | 183921 | 183968 | 184015 | 184062 | 184109 | 184155 | 184201 |

APPENDIX-continued

| Address | +0 | +1 | +2 | +3 | +4 | +5 | +6 | +7 |
|---|---|---|---|---|---|---|---|---|
| 2048 | 184246 | 184292 | 184336 | 184381 | 184425 | 184469 | 184512 | 184557 |
| 2056 | 184599 | 184641 | 184684 | 184725 | 184767 | 184808 | 184849 | 184889 |
| 2064 | 184929 | 184969 | 185009 | 185048 | 185088 | 185127 | 185165 | 185202 |
| 2072 | 185239 | 185277 | 185314 | 185349 | 185387 | 185422 | 185458 | 185492 |
| 2080 | 185528 | 185562 | 185597 | 185631 | 185664 | 185697 | 185730 | 185762 |
| 2088 | 185794 | 185825 | 185857 | 185888 | 185920 | 185950 | 185980 | 186010 |
| 2096 | 186040 | 186068 | 186097 | 186125 | 186154 | 186181 | 186208 | 186235 |
| 2104 | 186262 | 186288 | 186314 | 186340 | 186365 | 186390 | 186414 | 186438 |
| 2112 | 186462 | 186487 | 186510 | 186533 | 186555 | 186577 | 186600 | 186621 |
| 2120 | 186641 | 186663 | 186683 | 186703 | 186723 | 186741 | 186761 | 186780 |
| 2128 | 186798 | 186815 | 186834 | 186851 | 186868 | 186884 | 186901 | 186917 |
| 2136 | 186933 | 186948 | 186963 | 186977 | 186991 | 187005 | 187018 | 187031 |
| 2144 | 187044 | 187057 | 187068 | 187081 | 187093 | 187104 | 187114 | 187124 |
| 2152 | 187134 | 187144 | 187154 | 187163 | 187171 | 187180 | 187187 | 187194 |
| 2160 | 187201 | 187208 | 187214 | 187221 | 187227 | 187233 | 187237 | 187243 |
| 2168 | 187247 | 187251 | 187254 | 187257 | 187260 | 187263 | 187265 | 187267 |
| 2176 | 187268 | 187270 | 187271 | 187271 | 187271 | 187271 | 187271 | 187270 |
| 2184 | 187268 | 187267 | 187265 | 187263 | 187260 | 187257 | 187254 | 187251 |
| 2192 | 187247 | 187243 | 187237 | 187233 | 187227 | 187221 | 187214 | 187208 |
| 2200 | 187201 | 187194 | 187187 | 187180 | 187171 | 187163 | 187154 | 187144 |
| 2208 | 187134 | 187124 | 187114 | 187104 | 187093 | 187081 | 187068 | 187057 |
| 2216 | 187044 | 187031 | 187018 | 187005 | 186991 | 186977 | 186963 | 186948 |
| 2224 | 186933 | 186917 | 186901 | 186884 | 186868 | 186851 | 186834 | 186815 |
| 2232 | 186798 | 186780 | 186761 | 186741 | 186723 | 186703 | 186683 | 186663 |
| 2240 | 186641 | 186621 | 186600 | 186577 | 186555 | 186533 | 186510 | 186487 |
| 2248 | 186462 | 186438 | 186414 | 186390 | 186365 | 186340 | 186314 | 186288 |
| 2256 | 186262 | 186235 | 186208 | 186181 | 186154 | 186125 | 186097 | 186068 |
| 2264 | 186040 | 186010 | 185980 | 185950 | 185920 | 185888 | 185857 | 185825 |
| 2272 | 185794 | 185762 | 185730 | 185697 | 185664 | 185631 | 185597 | 185562 |
| 2280 | 185528 | 185492 | 185458 | 185422 | 185387 | 185349 | 185314 | 185277 |
| 2288 | 185239 | 185202 | 185165 | 185127 | 185088 | 185048 | 185009 | 184969 |
| 2296 | 184929 | 184889 | 184849 | 184808 | 184767 | 184725 | 184684 | 184641 |
| 2304 | 184599 | 184557 | 184512 | 184469 | 184425 | 184381 | 184336 | 184292 |
| 2312 | 184246 | 184201 | 184155 | 184109 | 184062 | 184015 | 183968 | 183921 |
| 2320 | 183874 | 183825 | 183776 | 183728 | 183679 | 183629 | 183579 | 183529 |
| 2328 | 183479 | 183428 | 183376 | 183325 | 183273 | 183222 | 183169 | 183116 |
| 2336 | 183063 | 183011 | 182956 | 182903 | 182849 | 182793 | 182739 | 182683 |
| 2344 | 182628 | 182572 | 182516 | 182459 | 182403 | 182346 | 182288 | 182230 |
| 2352 | 182172 | 182113 | 182055 | 181996 | 181936 | 181876 | 181816 | 181756 |
| 2360 | 181696 | 181635 | 181573 | 181512 | 181450 | 181389 | 181326 | 181263 |
| 2368 | 181200 | 181136 | 181073 | 181009 | 180945 | 180879 | 180815 | 180749 |
| 2376 | 180683 | 180617 | 180552 | 180484 | 180419 | 180352 | 180284 | 180216 |
| 2384 | 180149 | 180080 | 180012 | 179943 | 179873 | 179804 | 179734 | 179664 |
| 2392 | 179593 | 179523 | 179451 | 179380 | 179309 | 179236 | 179164 | 179091 |
| 2400 | 179019 | 178946 | 178873 | 178799 | 178726 | 178651 | 178576 | 178501 |
| 2408 | 178426 | 178350 | 178274 | 178198 | 178123 | 178046 | 177968 | 177891 |
| 2416 | 177814 | 177737 | 177658 | 177580 | 177501 | 177423 | 177344 | 177264 |
| 2424 | 177184 | 177104 | 177024 | 176944 | 176863 | 176781 | 176700 | 176618 |
| 2432 | 176537 | 176454 | 176371 | 176288 | 176205 | 176122 | 176038 | 175954 |
| 2440 | 175870 | 175785 | 175701 | 175615 | 175531 | 175445 | 175359 | 175272 |
| 2448 | 175187 | 175099 | 175012 | 174925 | 174838 | 174751 | 174662 | 174574 |
| 2456 | 174485 | 174396 | 174308 | 174218 | 174128 | 174038 | 173948 | 173858 |
| 2464 | 173766 | 173676 | 173585 | 173493 | 173402 | 173309 | 173218 | 173125 |
| 2472 | 173032 | 172939 | 172845 | 172752 | 172658 | 172563 | 172469 | 172375 |
| 2480 | 172280 | 172185 | 172089 | 171993 | 171898 | 171802 | 171705 | 171609 |
| 2488 | 171512 | 171415 | 171317 | 171219 | 171122 | 171023 | 170925 | 170826 |
| 2496 | 170727 | 170627 | 170529 | 170429 | 170329 | 170229 | 170129 | 170027 |
| 2504 | 169927 | 169826 | 169724 | 169623 | 169521 | 169419 | 169317 | 169214 |
| 2512 | 169111 | 169009 | 168906 | 168801 | 168699 | 168594 | 168490 | 168386 |
| 2520 | 168280 | 168176 | 168070 | 167966 | 167860 | 167754 | 167647 | 167541 |
| 2528 | 167434 | 167328 | 167221 | 167114 | 167005 | 166898 | 166791 | 166683 |
| 2536 | 166574 | 166465 | 166357 | 166248 | 166138 | 166030 | 165920 | 165810 |
| 2544 | 165700 | 165589 | 165478 | 165368 | 165257 | 165145 | 165034 | 164922 |
| 2552 | 164809 | 164698 | 164585 | 164472 | 164359 | 164246 | 164134 | 164019 |
| 2560 | 163906 | 163792 | 163678 | 163563 | 163449 | 163335 | 163221 | 163105 |
| 2568 | 162989 | 162873 | 162758 | 162642 | 162526 | 162409 | 162293 | 162176 |
| 2576 | 162059 | 161942 | 161825 | 161708 | 161589 | 161472 | 161353 | 161235 |
| 2584 | 161116 | 160997 | 160877 | 160759 | 160639 | 160520 | 160400 | 160280 |
| 2592 | 160160 | 160040 | 159919 | 159799 | 159677 | 159556 | 159434 | 159313 |
| 2600 | 159191 | 159069 | 158947 | 158824 | 158701 | 158578 | 158456 | 158333 |
| 2608 | 158210 | 158087 | 157963 | 157840 | 157716 | 157591 | 157467 | 157343 |
| 2616 | 157217 | 157093 | 156967 | 156843 | 156717 | 156591 | 156465 | 156338 |
| 2624 | 156212 | 156085 | 155960 | 155832 | 155705 | 155578 | 155451 | 155324 |
| 2632 | 155197 | 155068 | 154941 | 154812 | 154684 | 154555 | 154426 | 154298 |
| 2640 | 154169 | 154039 | 153911 | 153781 | 153651 | 153521 | 153391 | 153261 |
| 2648 | 153131 | 152999 | 152869 | 152738 | 152608 | 152476 | 152345 | 152213 |
| 2656 | 152082 | 151949 | 151818 | 151685 | 151553 | 151420 | 151287 | 151155 |

APPENDIX-continued

| Address | +0 | +1 | +2 | +3 | +4 | +5 | +6 | +7 |
|---|---|---|---|---|---|---|---|---|
| 2664 | 151022 | 150889 | 150756 | 150622 | 150489 | 150354 | 150220 | 150087 |
| 2672 | 149953 | 149819 | 149683 | 149549 | 149414 | 149279 | 149144 | 149009 |
| 2680 | 148873 | 148737 | 148601 | 148466 | 148330 | 148193 | 148057 | 147920 |
| 2688 | 147784 | 147647 | 147510 | 147373 | 147235 | 147098 | 146961 | 146823 |
| 2696 | 146685 | 146547 | 146410 | 146271 | 146132 | 145994 | 145855 | 145717 |
| 2704 | 145578 | 145438 | 145299 | 145159 | 145021 | 144881 | 144741 | 144601 |
| 2712 | 144461 | 144321 | 144181 | 144041 | 143899 | 143759 | 143618 | 143478 |
| 2720 | 143336 | 143195 | 143053 | 142912 | 142771 | 142629 | 142488 | 142345 |
| 2728 | 142203 | 142060 | 141918 | 141776 | 141633 | 141490 | 141347 | 141205 |
| 2736 | 141062 | 140919 | 140775 | 140632 | 140487 | 140344 | 140200 | 140057 |
| 2744 | 139913 | 139769 | 139624 | 139480 | 139334 | 139190 | 139046 | 138900 |
| 2752 | 138756 | 138610 | 138466 | 138320 | 138174 | 138028 | 137883 | 137737 |
| 2760 | 137591 | 137445 | 137300 | 137153 | 137007 | 136860 | 136714 | 136567 |
| 2768 | 136421 | 136274 | 136127 | 135980 | 135832 | 135685 | 135538 | 135391 |
| 2776 | 135242 | 135095 | 134947 | 134799 | 134651 | 134504 | 134355 | 134206 |
| 2784 | 134058 | 133909 | 133761 | 133612 | 133463 | 133315 | 133166 | 133016 |
| 2792 | 132868 | 132718 | 132569 | 132419 | 132270 | 132120 | 131970 | 131820 |
| 2800 | 131670 | 131520 | 131370 | 131220 | 131070 | 130919 | 130769 | 130619 |
| 2808 | 130469 | 130317 | 130167 | 130016 | 129864 | 129713 | 129563 | 129411 |
| 2816 | 129260 | 129109 | 128957 | 128806 | 128654 | 128503 | 128351 | 128200 |
| 2824 | 128047 | 127896 | 127743 | 127591 | 127438 | 127287 | 127134 | 126983 |
| 2832 | 126830 | 126677 | 126524 | 126371 | 126218 | 126065 | 125912 | 125759 |
| 2840 | 125607 | 125452 | 125299 | 125147 | 124994 | 124839 | 124686 | 124532 |
| 2848 | 124379 | 124225 | 124071 | 123916 | 123763 | 123609 | 123455 | 123302 |
| 2856 | 123148 | 122993 | 122839 | 122685 | 122530 | 122376 | 122220 | 122066 |
| 2864 | 121912 | 121757 | 121602 | 121447 | 121292 | 121137 | 120982 | 120827 |
| 2872 | 120672 | 120517 | 120362 | 120207 | 120052 | 119896 | 119740 | 119586 |
| 2880 | 119430 | 119274 | 119119 | 118963 | 118807 | 118651 | 118496 | 118340 |
| 2888 | 118184 | 118028 | 117871 | 117715 | 117560 | 117403 | 117247 | 117091 |
| 2896 | 116935 | 116778 | 116622 | 116465 | 116310 | 116152 | 115997 | 115839 |
| 2904 | 115684 | 115527 | 115371 | 115214 | 115057 | 114899 | 114744 | 114586 |
| 2912 | 114429 | 114274 | 114116 | 113959 | 113802 | 113645 | 113488 | 113331 |
| 2920 | 113173 | 113016 | 112859 | 112702 | 112545 | 112388 | 112230 | 112072 |
| 2928 | 111915 | 111757 | 111600 | 111443 | 111286 | 111127 | 110970 | 110813 |
| 2936 | 110656 | 110499 | 110340 | 110183 | 110026 | 109869 | 109710 | 109553 |
| 2944 | 109394 | 109237 | 109079 | 108921 | 108764 | 108607 | 108448 | 108291 |
| 2952 | 108133 | 107976 | 107817 | 107660 | 107501 | 107344 | 107185 | 107028 |
| 2960 | 106870 | 106712 | 106554 | 106397 | 106238 | 106081 | 105922 | 105764 |
| 2968 | 105607 | 105448 | 105291 | 105132 | 104975 | 104816 | 104659 | 104501 |
| 2976 | 104344 | 104185 | 104026 | 103869 | 103711 | 103553 | 103395 | 103238 |
| 2984 | 103079 | 102922 | 102763 | 102606 | 102448 | 102289 | 102132 | 101973 |
| 2992 | 101816 | 101657 | 101500 | 101342 | 101185 | 101027 | 100869 | 100712 |
| 3000 | 100553 | 100396 | 100237 | 100080 | 99921 | 99764 | 99606 | 99449 |
| 3008 | 99291 | 99133 | 98976 | 98817 | 98660 | 98503 | 98346 | 98188 |
| 3016 | 98030 | 97873 | 97715 | 97558 | 97400 | 97243 | 97085 | 96928 |
| 3024 | 96771 | 96614 | 96457 | 96300 | 96142 | 95985 | 95827 | 95669 |
| 3032 | 95512 | 95355 | 95198 | 95041 | 94885 | 94728 | 94571 | 94414 |
| 3040 | 94258 | 94101 | 93943 | 93788 | 93631 | 93473 | 93318 | 93161 |
| 3048 | 93005 | 92848 | 92692 | 92535 | 92379 | 92222 | 92066 | 91910 |
| 3056 | 91753 | 91597 | 91440 | 91285 | 91129 | 90972 | 90816 | 90660 |
| 3064 | 90504 | 90349 | 90193 | 90037 | 89881 | 89726 | 89570 | 89414 |
| 3072 | 89260 | 89104 | 88948 | 88794 | 88638 | 88484 | 88328 | 88173 |
| 3080 | 88018 | 87863 | 87708 | 87553 | 87398 | 87244 | 87090 | 86935 |
| 3088 | 86780 | 86625 | 86471 | 86317 | 86162 | 86008 | 85854 | 85699 |
| 3096 | 85545 | 85391 | 85238 | 85084 | 84931 | 84776 | 84622 | 84469 |
| 3104 | 84315 | 84162 | 84009 | 83856 | 83702 | 83549 | 83396 | 83243 |
| 3112 | 83091 | 82938 | 82785 | 82632 | 82479 | 82328 | 82175 | 82022 |
| 3120 | 81869 | 81717 | 81565 | 81413 | 81260 | 81109 | 80957 | 80804 |
| 3128 | 80653 | 80502 | 80350 | 80199 | 80047 | 79896 | 79746 | 79594 |
| 3136 | 79443 | 79291 | 79141 | 78990 | 78840 | 78688 | 78538 | 78388 |
| 3144 | 78238 | 78087 | 77937 | 77787 | 77637 | 77487 | 77338 | 77188 |
| 3152 | 77038 | 76890 | 76740 | 76591 | 76441 | 76292 | 76144 | 75994 |
| 3160 | 75845 | 75697 | 75548 | 75399 | 75251 | 75102 | 74955 | 74806 |
| 3168 | 74659 | 74511 | 74364 | 74215 | 74068 | 73919 | 73772 | 73625 |
| 3176 | 73478 | 73331 | 73185 | 73038 | 72890 | 72745 | 72598 | 72452 |
| 3184 | 72305 | 72159 | 72013 | 71866 | 71720 | 71575 | 71429 | 71283 |
| 3192 | 71139 | 70993 | 70847 | 70703 | 70557 | 70413 | 70269 | 70123 |
| 3200 | 69979 | 69834 | 69690 | 69546 | 69403 | 69259 | 69114 | 68971 |
| 3208 | 68827 | 68684 | 68541 | 68397 | 68254 | 68111 | 67968 | 67825 |
| 3216 | 67683 | 67541 | 67398 | 67257 | 67114 | 66972 | 66831 | 66688 |
| 3224 | 66547 | 66405 | 66264 | 66122 | 65982 | 65841 | 65701 | 65559 |
| 3232 | 65419 | 65278 | 65138 | 64998 | 64858 | 64718 | 64579 | 64439 |
| 3240 | 64299 | 64161 | 64021 | 63882 | 63743 | 63605 | 63466 | 63328 |
| 3248 | 63189 | 63050 | 62912 | 62773 | 62636 | 62498 | 62360 | 62223 |
| 3256 | 62086 | 61949 | 61812 | 61675 | 61539 | 61402 | 61266 | 61129 |
| 3264 | 60993 | 60856 | 60720 | 60584 | 60449 | 60313 | 60179 | 60043 |
| 3272 | 59909 | 59773 | 59639 | 59504 | 59370 | 59236 | 59101 | 58967 |

APPENDIX-continued

| Address | +0 | +1 | +2 | +3 | +4 | +5 | +6 | +7 |
|---|---|---|---|---|---|---|---|---|
| 3280 | 58833 | 58700 | 58566 | 58433 | 58300 | 58167 | 58034 | 57901 |
| 3288 | 57768 | 57635 | 57503 | 57371 | 57238 | 57107 | 56975 | 56844 |
| 3296 | 56712 | 56581 | 56450 | 56318 | 56188 | 56057 | 55927 | 55795 |
| 3304 | 55665 | 55535 | 55405 | 55275 | 55146 | 55016 | 54888 | 54758 |
| 3312 | 54629 | 54501 | 54372 | 54244 | 54115 | 53988 | 53859 | 53732 |
| 3320 | 53603 | 53476 | 53349 | 53222 | 53095 | 52968 | 52840 | 52715 |
| 3328 | 52588 | 52462 | 52336 | 52209 | 52083 | 51957 | 51832 | 51707 |
| 3336 | 51582 | 51457 | 51333 | 51207 | 51083 | 50959 | 50834 | 50710 |
| 3344 | 50587 | 50463 | 50340 | 50217 | 50094 | 49971 | 49849 | 49726 |
| 3352 | 49603 | 49480 | 49359 | 49236 | 49114 | 48993 | 48871 | 48750 |
| 3360 | 48630 | 48508 | 48388 | 48267 | 48147 | 48025 | 47905 | 47785 |
| 3368 | 47667 | 47547 | 47428 | 47308 | 47190 | 47070 | 46951 | 46832 |
| 3376 | 46715 | 46597 | 46480 | 46361 | 46244 | 46125 | 46008 | 45891 |
| 3384 | 45774 | 45657 | 45541 | 45424 | 45308 | 45192 | 45076 | 44961 |
| 3392 | 44845 | 44729 | 44614 | 44499 | 44384 | 44269 | 44155 | 44041 |
| 3400 | 43926 | 43812 | 43699 | 43585 | 43472 | 43358 | 43245 | 43132 |
| 3408 | 43019 | 42906 | 42795 | 42682 | 42570 | 42458 | 42346 | 42235 |
| 3416 | 42123 | 42012 | 41902 | 41790 | 41680 | 41569 | 41459 | 41349 |
| 3424 | 41239 | 41129 | 41020 | 40910 | 40802 | 40692 | 40583 | 40474 |
| 3432 | 40366 | 40257 | 40150 | 40041 | 39934 | 39826 | 39719 | 39611 |
| 3440 | 39504 | 39397 | 39291 | 39184 | 39078 | 38971 | 38866 | 38760 |
| 3448 | 38654 | 38550 | 38444 | 38340 | 38234 | 38130 | 38025 | 37921 |
| 3456 | 37817 | 37713 | 37608 | 37505 | 37401 | 37298 | 37195 | 37092 |
| 3464 | 36990 | 36887 | 36785 | 36682 | 36581 | 36478 | 36377 | 36275 |
| 3472 | 36174 | 36072 | 35972 | 35871 | 35771 | 35671 | 35571 | 35471 |
| 3480 | 35371 | 35271 | 35171 | 35072 | 34972 | 34874 | 34775 | 34676 |
| 3488 | 34578 | 34479 | 34382 | 34283 | 34186 | 34089 | 33992 | 33895 |
| 3496 | 33798 | 33701 | 33603 | 33508 | 33411 | 33315 | 33219 | 33123 |
| 3504 | 33028 | 32932 | 32838 | 32742 | 32648 | 32553 | 32459 | 32365 |
| 3512 | 32270 | 32176 | 32082 | 31989 | 31895 | 31802 | 31709 | 31616 |
| 3520 | 31523 | 31430 | 31339 | 31246 | 31154 | 31062 | 30970 | 30879 |
| 3528 | 30789 | 30697 | 30606 | 30516 | 30424 | 30334 | 30244 | 30154 |
| 3536 | 30064 | 29974 | 29886 | 29796 | 29707 | 29617 | 29529 | 29440 |
| 3544 | 29351 | 29263 | 29176 | 29087 | 29000 | 28911 | 28824 | 28737 |
| 3552 | 28650 | 28563 | 28476 | 28390 | 28303 | 28217 | 28131 | 28045 |
| 3560 | 27960 | 27874 | 27788 | 27704 | 27618 | 27534 | 27450 | 27364 |
| 3568 | 27280 | 27195 | 27111 | 27028 | 26944 | 26861 | 26778 | 26694 |
| 3576 | 26611 | 26528 | 26445 | 26364 | 26281 | 26199 | 26118 | 26035 |
| 3584 | 25954 | 25872 | 25791 | 25709 | 25629 | 25548 | 25468 | 25387 |
| 3592 | 25306 | 25226 | 25146 | 25066 | 24988 | 24908 | 24829 | 24749 |
| 3600 | 24671 | 24592 | 24514 | 24435 | 24358 | 24279 | 24202 | 24123 |
| 3608 | 24046 | 23969 | 23892 | 23815 | 23738 | 23661 | 23583 | 23508 |
| 3616 | 23431 | 23355 | 23279 | 23203 | 23128 | 23052 | 22976 | 22902 |
| 3624 | 22826 | 22752 | 22678 | 22603 | 22529 | 22455 | 22380 | 22306 |
| 3632 | 22233 | 22159 | 22086 | 22012 | 21939 | 21866 | 21793 | 21722 |
| 3640 | 21649 | 21577 | 21505 | 21433 | 21362 | 21290 | 21219 | 21147 |
| 3648 | 21076 | 21004 | 20933 | 20863 | 20793 | 20723 | 20653 | 20583 |
| 3656 | 20513 | 20443 | 20373 | 20304 | 20234 | 20166 | 20096 | 20027 |
| 3664 | 19959 | 19890 | 19823 | 19754 | 19687 | 19619 | 19551 | 19483 |
| 3672 | 19416 | 19348 | 19281 | 19214 | 19148 | 19081 | 19016 | 18948 |
| 3680 | 18883 | 18817 | 18751 | 18686 | 18620 | 18554 | 18490 | 18424 |
| 3688 | 18360 | 18294 | 18230 | 18165 | 18101 | 18037 | 17974 | 17910 |
| 3696 | 17845 | 17783 | 17720 | 17655 | 17593 | 17530 | 17467 | 17404 |
| 3704 | 17342 | 17280 | 17218 | 17155 | 17094 | 17032 | 16971 | 16910 |
| 3712 | 16848 | 16787 | 16725 | 16665 | 16604 | 16544 | 16484 | 16422 |
| 3720 | 16362 | 16302 | 16244 | 16184 | 16124 | 16065 | 16005 | 15947 |
| 3728 | 15888 | 15829 | 15771 | 15712 | 15654 | 15595 | 15537 | 15479 |
| 3736 | 15421 | 15364 | 15306 | 15249 | 15192 | 15135 | 15078 | 15021 |
| 3744 | 14965 | 14908 | 14852 | 14795 | 14739 | 14684 | 14628 | 14572 |
| 3752 | 14516 | 14461 | 14406 | 14351 | 14296 | 14241 | 14186 | 14132 |
| 3760 | 14078 | 14023 | 13971 | 13916 | 13862 | 13809 | 13755 | 13702 |
| 3768 | 13648 | 13595 | 13542 | 13489 | 13436 | 13383 | 13332 | 13279 |
| 3776 | 13228 | 13175 | 13123 | 13072 | 13020 | 12969 | 12918 | 12866 |
| 3784 | 12815 | 12765 | 12713 | 12663 | 12612 | 12562 | 12512 | 12462 |
| 3792 | 12412 | 12362 | 12312 | 12262 | 12213 | 12163 | 12115 | 12065 |
| 3800 | 12016 | 11967 | 11919 | 11870 | 11822 | 11773 | 11725 | 11677 |
| 3808 | 11629 | 11582 | 11535 | 11486 | 11439 | 11392 | 11344 | 11297 |
| 3816 | 11250 | 11203 | 11157 | 11110 | 11064 | 11017 | 10972 | 10926 |
| 3824 | 10880 | 10834 | 10789 | 10743 | 10697 | 10653 | 10607 | 10563 |
| 3832 | 10517 | 10473 | 10429 | 10384 | 10340 | 10296 | 10251 | 10207 |
| 3840 | 10163 | 10120 | 10076 | 10033 | 9989 | 9946 | 9903 | 9859 |
| 3848 | 9816 | 9773 | 9731 | 9689 | 9646 | 9603 | 9561 | 9519 |
| 3856 | 9477 | 9434 | 9393 | 9351 | 9310 | 9268 | 9227 | 9186 |
| 3864 | 9146 | 9104 | 9064 | 9023 | 8983 | 8941 | 8901 | 8861 |
| 3872 | 8821 | 8781 | 8741 | 8701 | 8661 | 8623 | 8583 | 8544 |
| 3880 | 8504 | 8466 | 8427 | 8387 | 8348 | 8310 | 8271 | 8233 |
| 3888 | 8194 | 8155 | 8118 | 8080 | 8043 | 8004 | 7967 | 7930 |

APPENDIX-continued

| Address | +0 | +1 | +2 | +3 | +4 | +5 | +6 | +7 |
|---|---|---|---|---|---|---|---|---|
| 3896 | 7893 | 7855 | 7818 | 7781 | 7744 | 7707 | 7670 | 7633 |
| 3904 | 7597 | 7560 | 7524 | 7487 | 7451 | 7415 | 7380 | 7344 |
| 3912 | 7308 | 7272 | 7237 | 7201 | 7167 | 7131 | 7097 | 7061 |
| 3920 | 7027 | 6991 | 6957 | 6922 | 6888 | 6854 | 6820 | 6785 |
| 3928 | 6751 | 6717 | 6684 | 6650 | 6617 | 6582 | 6550 | 6515 |
| 3936 | 6482 | 6449 | 6417 | 6384 | 6351 | 6318 | 6287 | 6254 |
| 3944 | 6221 | 6189 | 6157 | 6125 | 6092 | 6061 | 6029 | 5998 |
| 3952 | 5967 | 5935 | 5904 | 5872 | 5841 | 5811 | 5779 | 5749 |
| 3960 | 5718 | 5688 | 5657 | 5627 | 5597 | 5567 | 5537 | 5507 |
| 3968 | 5477 | 5446 | 5416 | 5386 | 5358 | 5328 | 5299 | 5269 |
| 3976 | 5241 | 5212 | 5184 | 5155 | 5126 | 5098 | 5069 | 5041 |
| 3984 | 5012 | 4984 | 4956 | 4928 | 4901 | 4872 | 4845 | 4818 |
| 3992 | 4791 | 4762 | 4735 | 4708 | 4681 | 4654 | 4628 | 4601 |
| 4000 | 4574 | 4548 | 4521 | 4495 | 4469 | 4443 | 4416 | 4391 |
| 4008 | 4365 | 4339 | 4313 | 4288 | 4262 | 4236 | 4212 | 4186 |
| 4016 | 4162 | 4136 | 4112 | 4088 | 4063 | 4038 | 4013 | 3989 |
| 4024 | 3965 | 3941 | 3918 | 3893 | 3869 | 3846 | 3822 | 3799 |
| 4032 | 3775 | 3752 | 3729 | 3706 | 3683 | 3661 | 3638 | 3615 |
| 4040 | 3592 | 3569 | 3546 | 3525 | 3502 | 3480 | 3458 | 3436 |
| 4048 | 3415 | 3392 | 3370 | 3349 | 3328 | 3306 | 3285 | 3263 |
| 4056 | 3243 | 3222 | 3202 | 3180 | 3160 | 3139 | 3119 | 3098 |
| 4064 | 3078 | 3058 | 3038 | 3018 | 2998 | 2978 | 2959 | 2939 |
| 4072 | 2919 | 2900 | 2880 | 2862 | 2842 | 2823 | 2805 | 2785 |
| 4080 | 2766 | 2748 | 2729 | 2710 | 2692 | 2673 | 2656 | 2638 |
| 4088 | 2619 | 2602 | 2583 | 2566 | 2549 | 2532 | 2513 | 2496 |
| 4096 | 2479 | 2462 | 2445 | 2427 | 2410 | 2393 | 2376 | 2359 |
| 4104 | 2343 | 2326 | 2310 | 2293 | 2277 | 2262 | 2246 | 2230 |
| 4112 | 2213 | 2197 | 2182 | 2166 | 2150 | 2135 | 2119 | 2103 |
| 4120 | 2089 | 2073 | 2059 | 2043 | 2029 | 2013 | 1999 | 1983 |
| 4128 | 1969 | 1955 | 1940 | 1926 | 1912 | 1897 | 1883 | 1869 |
| 4136 | 1855 | 1840 | 1826 | 1813 | 1799 | 1786 | 1772 | 1759 |
| 4144 | 1745 | 1732 | 1717 | 1705 | 1692 | 1677 | 1665 | 1652 |
| 4152 | 1639 | 1626 | 1613 | 1600 | 1587 | 1575 | 1563 | 1550 |
| 4160 | 1537 | 1525 | 1513 | 1500 | 1489 | 1476 | 1464 | 1452 |
| 4168 | 1440 | 1427 | 1416 | 1404 | 1393 | 1380 | 1369 | 1357 |
| 4176 | 1346 | 1334 | 1323 | 1312 | 1300 | 1289 | 1279 | 1267 |
| 4184 | 1256 | 1246 | 1234 | 1223 | 1212 | 1200 | 1190 | 1179 |
| 4192 | 1169 | 1157 | 1147 | 1137 | 1126 | 1116 | 1104 | 1094 |
| 4200 | 1084 | 1073 | 1063 | 1053 | 1043 | 1033 | 1023 | 1013 |
| 4208 | 1003 | 993 | 983 | 973 | 963 | 953 | 943 | 933 |
| 4216 | 923 | 914 | 904 | 894 | 884 | 874 | 866 | 856 |
| 4224 | 847 | 837 | 827 | 819 | 809 | 800 | 790 | 782 |
| 4232 | 772 | 763 | 753 | 744 | 736 | 727 | 717 | 709 |
| 4240 | 700 | 690 | 682 | 673 | 664 | 656 | 647 | 639 |
| 4248 | 630 | 622 | 613 | 604 | 596 | 587 | 579 | 570 |
| 4256 | 562 | 554 | 546 | 537 | 529 | 520 | 513 | 504 |
| 4264 | 497 | 489 | 480 | 473 | 464 | 457 | 449 | 441 |
| 4272 | 434 | 426 | 419 | 410 | 403 | 396 | 389 | 381 |
| 4280 | 374 | 367 | 360 | 353 | 346 | 339 | 331 | 324 |
| 4288 | 317 | 310 | 303 | 296 | 290 | 283 | 277 | 270 |
| 4296 | 264 | 257 | 251 | 244 | 239 | 233 | 227 | 220 |
| 4304 | 214 | 209 | 203 | 197 | 191 | 186 | 180 | 174 |
| 4312 | 170 | 164 | 159 | 154 | 149 | 144 | 139 | 134 |
| 4320 | 130 | 126 | 120 | 116 | 111 | 107 | 103 | 99 |
| 4328 | 94 | 91 | 87 | 83 | 79 | 76 | 71 | 69 |
| 4336 | 64 | 61 | 59 | 56 | 53 | 50 | 47 | 44 |
| 4344 | 41 | 39 | 36 | 33 | 31 | 29 | 27 | 24 |
| 4352 | 23 | 20 | 19 | 16 | 16 | 16 | 16 | 17 |
| 4360 | 16 | | | | | | | |

Output Word Rate = 7.512 Hz

| | | | | | | | |
|---|---|---|---|---|---|---|---|
| 0 | 16 | 16 | 16 | 19 | 23 | 27 | 31 | 36 |
| 8 | 41 | 47 | 53 | 59 | 64 | 71 | 79 | 87 |
| 16 | 94 | 103 | 111 | 120 | 130 | 139 | 149 | 159 |
| 24 | 170 | 180 | 191 | 203 | 214 | 227 | 239 | 251 |
| 32 | 264 | 277 | 290 | 303 | 317 | 331 | 346 | 360 |
| 40 | 374 | 389 | 403 | 419 | 434 | 449 | 464 | 480 |
| 48 | 497 | 513 | 529 | 546 | 562 | 579 | 596 | 613 |
| 56 | 630 | 647 | 664 | 682 | 700 | 717 | 736 | 753 |
| 64 | 772 | 790 | 809 | 827 | 847 | 866 | 884 | 904 |
| 72 | 923 | 943 | 963 | 983 | 1003 | 1023 | 1043 | 1063 |
| 80 | 1084 | 1104 | 1126 | 1147 | 1169 | 1190 | 1212 | 1234 |
| 88 | 1256 | 1279 | 1300 | 1323 | 1346 | 1369 | 1393 | 1416 |
| 96 | 1440 | 1464 | 1489 | 1513 | 1537 | 1563 | 1587 | 1613 |
| 104 | 1639 | 1665 | 1692 | 1717 | 1745 | 1772 | 1799 | 1826 |
| 112 | 1855 | 1883 | 1912 | 1940 | 1969 | 1999 | 2029 | 2059 |
| 120 | 2089 | 2119 | 2150 | 2182 | 2213 | 2246 | 2277 | 2310 |

APPENDIX-continued

| Address | +0 | +1 | +2 | +3 | +4 | +5 | +6 | +7 |
|---|---|---|---|---|---|---|---|---|
| 128 | 2343 | 2376 | 2410 | 2445 | 2479 | 2513 | 2549 | 2583 |
| 136 | 2619 | 2656 | 2692 | 2729 | 2766 | 2805 | 2842 | 2880 |
| 144 | 2919 | 2959 | 2998 | 3038 | 3078 | 3119 | 3160 | 3202 |
| 152 | 3243 | 3285 | 3328 | 3370 | 3415 | 3458 | 3502 | 3546 |
| 160 | 3592 | 3638 | 3683 | 3729 | 3775 | 3822 | 3869 | 3918 |
| 168 | 3965 | 4013 | 4063 | 4112 | 4162 | 4212 | 4262 | 4313 |
| 176 | 4365 | 4416 | 4469 | 4521 | 4574 | 4628 | 4681 | 4735 |
| 184 | 4791 | 4845 | 4901 | 4956 | 5012 | 5069 | 5126 | 5184 |
| 192 | 5241 | 5299 | 5358 | 5416 | 5476 | 5537 | 5597 | 5657 |
| 200 | 5718 | 5779 | 5841 | 5904 | 5967 | 6029 | 6092 | 6157 |
| 208 | 6221 | 6287 | 6351 | 6417 | 6482 | 6550 | 6617 | 6684 |
| 216 | 6751 | 6820 | 6888 | 6957 | 7027 | 7097 | 7167 | 7237 |
| 224 | 7308 | 7380 | 7451 | 7524 | 7597 | 7670 | 7744 | 7818 |
| 232 | 7893 | 7967 | 8043 | 8118 | 8194 | 8271 | 8348 | 8427 |
| 240 | 8504 | 8583 | 8661 | 8741 | 8821 | 8901 | 8983 | 9064 |
| 248 | 9146 | 9227 | 9310 | 9393 | 9477 | 9561 | 9646 | 9731 |
| 256 | 9816 | 9903 | 9989 | 10076 | 10163 | 10251 | 10340 | 10429 |
| 264 | 10517 | 10607 | 10697 | 10789 | 10880 | 10972 | 11064 | 11157 |
| 272 | 11250 | 11344 | 11439 | 11535 | 11629 | 11725 | 11822 | 11919 |
| 280 | 12016 | 12115 | 12213 | 12312 | 12412 | 12512 | 12612 | 12713 |
| 288 | 12815 | 12918 | 13020 | 13123 | 13228 | 13332 | 13436 | 13542 |
| 296 | 13648 | 13755 | 13862 | 13971 | 14078 | 14186 | 14296 | 14406 |
| 304 | 14516 | 14628 | 14739 | 14852 | 14965 | 15078 | 15192 | 15306 |
| 312 | 15421 | 15537 | 15654 | 15771 | 15888 | 16005 | 16124 | 16244 |
| 320 | 16362 | 16484 | 16604 | 16725 | 16848 | 16971 | 17094 | 17218 |
| 328 | 17342 | 17467 | 17593 | 17720 | 17845 | 17974 | 18101 | 18230 |
| 336 | 18360 | 18490 | 18620 | 18751 | 18883 | 19016 | 19148 | 19281 |
| 344 | 19416 | 19551 | 19687 | 19823 | 19959 | 20096 | 20234 | 20373 |
| 352 | 20513 | 20653 | 20793 | 20933 | 21076 | 21219 | 21362 | 21505 |
| 360 | 21649 | 21793 | 21939 | 22086 | 22233 | 22380 | 22529 | 22678 |
| 368 | 22826 | 22976 | 23128 | 23279 | 23431 | 23583 | 23738 | 23892 |
| 376 | 24046 | 24202 | 24358 | 24514 | 24671 | 24829 | 24988 | 25146 |
| 384 | 25306 | 25468 | 25629 | 25791 | 25954 | 26118 | 26281 | 26445 |
| 392 | 26611 | 26777 | 26944 | 27111 | 27280 | 27450 | 27618 | 27788 |
| 400 | 27960 | 28131 | 28303 | 28476 | 28650 | 28824 | 29000 | 29176 |
| 408 | 29351 | 29529 | 29707 | 29886 | 30064 | 30244 | 30424 | 30606 |
| 416 | 30789 | 30970 | 31154 | 31339 | 31523 | 31709 | 31895 | 32082 |
| 424 | 32270 | 32458 | 32648 | 32838 | 33028 | 33219 | 33411 | 33603 |
| 432 | 33798 | 33992 | 34186 | 34382 | 34578 | 34775 | 34972 | 35171 |
| 440 | 35371 | 35571 | 35771 | 35972 | 36174 | 36377 | 36581 | 36785 |
| 448 | 36990 | 37195 | 37401 | 37608 | 37817 | 38025 | 38234 | 38444 |
| 456 | 38654 | 38866 | 39078 | 39291 | 39504 | 39719 | 39934 | 40150 |
| 464 | 40366 | 40583 | 40802 | 41020 | 41239 | 41459 | 41680 | 41902 |
| 472 | 42123 | 42346 | 42570 | 42795 | 43019 | 43245 | 43472 | 43699 |
| 480 | 43926 | 44155 | 44384 | 44614 | 44845 | 45076 | 45308 | 45541 |
| 488 | 45774 | 46008 | 46244 | 46480 | 46715 | 46951 | 47190 | 47428 |
| 496 | 47667 | 47905 | 48147 | 48388 | 48630 | 48871 | 49114 | 49359 |
| 504 | 49603 | 49849 | 50094 | 50340 | 50587 | 50834 | 51083 | 51333 |
| 512 | 51582 | 51832 | 52083 | 52336 | 52588 | 52840 | 53095 | 53349 |
| 520 | 53603 | 53859 | 54115 | 54372 | 54629 | 54888 | 55146 | 55405 |
| 528 | 55665 | 55927 | 56188 | 56450 | 56712 | 56975 | 57238 | 57503 |
| 536 | 57768 | 58034 | 58300 | 58566 | 58833 | 59161 | 59370 | 59639 |
| 544 | 59909 | 60179 | 60449 | 60720 | 60993 | 61266 | 61539 | 61812 |
| 552 | 62086 | 62360 | 62636 | 62912 | 63189 | 63466 | 63743 | 64021 |
| 560 | 64299 | 64579 | 64858 | 65138 | 65419 | 65701 | 65982 | 66264 |
| 568 | 66547 | 66831 | 67114 | 67398 | 67683 | 67968 | 68254 | 68541 |
| 576 | 68827 | 69114 | 69403 | 69690 | 69979 | 70269 | 70557 | 70847 |
| 584 | 71139 | 71429 | 71720 | 72013 | 72305 | 72598 | 72890 | 73185 |
| 592 | 73478 | 73772 | 74068 | 74364 | 74659 | 74955 | 75251 | 75548 |
| 600 | 75845 | 76144 | 76441 | 76740 | 77038 | 77338 | 77637 | 77937 |
| 608 | 78238 | 78538 | 78840 | 79141 | 79443 | 79746 | 80047 | 80350 |
| 616 | 80653 | 80957 | 81260 | 81565 | 81869 | 82175 | 82479 | 82785 |
| 624 | 83090 | 83396 | 83702 | 84009 | 84315 | 84622 | 84931 | 85238 |
| 632 | 85545 | 85854 | 86162 | 86471 | *86780 | 87090 | 87398 | 87708 |
| 640 | 88018 | 88328 | 88638 | 88948 | 89260 | 89570 | 89881 | 90193 |
| 648 | 90504 | 90816 | 91129 | 91440 | 91753 | 92066 | 92379 | 92692 |
| 656 | 93005 | 93318 | 93631 | 93943 | 94258 | 94571 | 94885 | 95198 |
| 664 | 95512 | 95827 | 96142 | 96457 | 96771 | 97085 | 97400 | 97715 |
| 672 | 98030 | 98346 | 98660 | 98976 | 99291 | 99606 | 99921 | 100237 |
| 680 | 100553 | 100869 | 101185 | 101500 | 101816 | 102132 | 102448 | 102763 |
| 688 | 103079 | 103395 | 103711 | 104026 | 104344 | 104659 | 104975 | 105291 |
| 696 | 105607 | 105922 | 106238 | 106554 | 106870 | 107185 | 107501 | 107817 |
| 704 | 108133 | 108448 | 108764 | 109078 | 109394 | 109710 | 110026 | 110340 |
| 712 | 110656 | 110970 | 111286 | 111600 | 111915 | 112230 | 112545 | 112859 |
| 720 | 113173 | 113488 | 113802 | 114116 | 114429 | 114744 | 115056 | 115371 |
| 728 | 115684 | 115997 | 116310 | 116622 | 116935 | 117247 | 117560 | 117871 |
| 736 | 118184 | 118496 | 118807 | 119119 | 119430 | 119740 | 120051 | 120362 |

APPENDIX-continued

| Address | +0 | +1 | +2 | +3 | +4 | +5 | +6 | +7 |
|---|---|---|---|---|---|---|---|---|
| 744 | 120672 | 120982 | 121292 | 121602 | 121912 | 122220 | 122530 | 122839 |
| 752 | 123148 | 123455 | 123763 | 124071 | 124379 | 124686 | 124994 | 125299 |
| 760 | 125607 | 125912 | 126218 | 126524 | 126830 | 127134 | 127438 | 127743 |
| 768 | 128047 | 128351 | 128654 | 128957 | 129260 | 129563 | 129864 | 130167 |
| 776 | 130469 | 130769 | 131070 | 131370 | 131670 | 131970 | 132270 | 132569 |
| 784 | 132868 | 133166 | 133463 | 133761 | 134058 | 134355 | 134651 | 134946 |
| 792 | 135242 | 135538 | 135832 | 136127 | 136421 | 136714 | 137007 | 137300 |
| 800 | 137591 | 137883 | 138174 | 138466 | 138756 | 139046 | 139334 | 139624 |
| 808 | 139913 | 140200 | 140487 | 140774 | 141062 | 141347 | 141633 | 141917 |
| 816 | 142203 | 142488 | 142770 | 143053 | 143336 | 143618 | 143899 | 144181 |
| 824 | 144461 | 144741 | 145021 | 145299 | 145578 | 145855 | 146132 | 146410 |
| 832 | 146685 | 146961 | 147235 | 147510 | 147784 | 148057 | 148330 | 148601 |
| 840 | 148873 | 149144 | 149414 | 149683 | 149953 | 150220 | 150489 | 150756 |
| 848 | 151022 | 151287 | 151553 | 151817 | 152082 | 152345 | 152608 | 152869 |
| 856 | 153131 | 153391 | 153651 | 153911 | 154169 | 154426 | 154684 | 154941 |
| 864 | 155197 | 155451 | 155705 | 155960 | 156212 | 156465 | 156717 | 156967 |
| 872 | 157217 | 157467 | 157715 | 157963 | 18210 | 158456 | 158701 | 158947 |
| 880 | 159191 | 159434 | 159677 | 159919 | 160160 | 160400 | 160639 | 160877 |
| 888 | 161116 | 161353 | 161589 | 161825 | 162059 | 162293 | 162526 | 162758 |
| 896 | 162989 | 163221 | 163449 | 163678 | 163906 | 164134 | 164359 | 164585 |
| 904 | 164809 | 165034 | 165257 | 165478 | 165699 | 165920 | 166138 | 166357 |
| 912 | 166574 | 166791 | 167005 | 167221 | 167434 | 167647 | 167860 | 168070 |
| 920 | 168280 | 168490 | 168698 | 168906 | 169111 | 169317 | 169521 | 169724 |
| 928 | 169927 | 170129 | 170329 | 170529 | 170727 | 170925 | 171122 | 171317 |
| 936 | 171512 | 171705 | 171898 | 172089 | 172280 | 172469 | 172658 | 172845 |
| 944 | 173032 | 173218 | 173402 | 173585 | 173766 | 173948 | 174128 | 174308 |
| 952 | 174485 | 174662 | 174838 | 175012 | 175187 | 175359 | 175531 | 175701 |
| 960 | 175870 | 176038 | 176205 | 176371 | 176537 | 176700 | 176863 | 177024 |
| 968 | 177184 | 177344 | 177501 | 177658 | 177814 | 177968 | 178123 | 178274 |
| 976 | 178426 | 178576 | 178726 | 178873 | 179019 | 179164 | 179309 | 179451 |
| 984 | 179593 | 179734 | 179873 | 180012 | 180149 | 180284 | 180419 | 180552 |
| 992 | 180683 | 180814 | 180945 | 181073 | 181200 | 181326 | 181450 | 181573 |
| 1000 | 181696 | 181816 | 181936 | 182055 | 182172 | 182288 | 182403 | 182516 |
| 1008 | 182628 | 182739 | 182849 | 182956 | 183063 | 183169 | 183273 | 183376 |
| 1016 | 183479 | 183579 | 183679 | 183776 | 183874 | 183968 | 184062 | 184155 |
| 1024 | 184246 | 184336 | 184425 | 184512 | 184599 | 184684 | 184766 | 184849 |
| 1032 | 184929 | 185009 | 185088 | 185165 | 185239 | 185314 | 185387 | 185458 |
| 1040 | 185528 | 185597 | 185664 | 185729 | 185794 | 185857 | 185920 | 185980 |
| 1048 | 186040 | 186097 | 186154 | 186208 | 186262 | 186314 | 186365 | 186414 |
| 1056 | 186462 | 186510 | 186555 | 186600 | 186641 | 186682 | 186722 | 186761 |
| 1064 | 186798 | 186834 | 186868 | 186901 | 186933 | 186963 | 186991 | 187018 |
| 1072 | 187044 | 187068 | 187093 | 187114 | 187134 | 187154 | 187171 | 187187 |
| 1080 | 187201 | 187214 | 187227 | 187237 | 187247 | 187254 | 187260 | 187265 |
| 1088 | 187268 | 187271 | 187271 | 187271 | 187268 | 187265 | 187260 | 187254 |
| 1096 | 187247 | 187237 | 187227 | 187214 | 187201 | 187187 | 187171 | 187154 |
| 1104 | 187134 | 187114 | 187093 | 187068 | 187044 | 187018 | 186991 | 186963 |
| 1112 | 186933 | 186901 | 186868 | 186834 | 186798 | 186761 | 186722 | 186682 |
| 1120 | 186641 | 186600 | 186555 | 186510 | 186462 | 186414 | 186365 | 186314 |
| 1128 | 186262 | 186208 | 186154 | 186097 | 186040 | 185980 | 185920 | 185857 |
| 1136 | 185794 | 185729 | 185664 | 185597 | 185528 | 185458 | 185387 | 185314 |
| 1144 | 185239 | 185165 | 185088 | 185009 | 184929 | 184849 | 184766 | 184684 |
| 1152 | 184599 | 184512 | 184425 | 184336 | 184246 | 184155 | 184062 | 183968 |
| 1160 | 183874 | 183776 | 183679 | 183579 | 183479 | 183376 | 183273 | 183169 |
| 1168 | 183063 | 182956 | 182849 | 182739 | 182628 | 182516 | 182403 | 182288 |
| 1176 | 182172 | 182055 | 181936 | 181816 | 181696 | 181573 | 181450 | 181326 |
| 1184 | 181200 | 181073 | 180945 | 180814 | 180683 | 180552 | 180419 | 180284 |
| 1192 | 180149 | 180012 | 179873 | 179734 | 179593 | 179451 | 179309 | 179164 |
| 1200 | 179019 | 178873 | 178726 | 178576 | 178426 | 178274 | 178123 | 177968 |
| 1208 | 177814 | 177658 | 177501 | 177344 | 177184 | 177024 | 176863 | 176700 |
| 1216 | 176537 | 176371 | 176205 | 176038 | 175870 | 175701 | 175531 | 175359 |
| 1224 | 175187 | 175012 | 174838 | 174662 | 174485 | 174308 | 174128 | 173948 |
| 1232 | 173766 | 173585 | 173402 | 173218 | 173032 | 172845 | 172658 | 172469 |
| 1240 | 172280 | 172089 | 171898 | 171705 | 171512 | 171317 | 171122 | 170925 |
| 1248 | 170727 | 170529 | 170329 | 170129 | 169927 | 169724 | 169521 | 169317 |
| 1256 | 169111 | 168906 | 168698 | 168490 | 168280 | 168070 | 167860 | 167647 |
| 1264 | 167434 | 167221 | 167005 | 166791 | 166574 | 166357 | 166138 | 165920 |
| 1272 | 165699 | 165478 | 165257 | 165034 | 164809 | 164585 | 164359 | 164134 |
| 1280 | 163906 | 163678 | 163449 | 163221 | 162989 | 162758 | 162526 | 162293 |
| 1288 | 162059 | 161825 | 161589 | 161353 | 161116 | 160877 | 160639 | 160400 |
| 1296 | 160160 | 159919 | 159677 | 159434 | 159191 | 158947 | 158701 | 158456 |
| 1304 | 158210 | 157963 | 157715 | 157467 | 157217 | 156967 | 156717 | 156465 |
| 1312 | 156212 | 155960 | 155705 | 155451 | 155197 | 154941 | 154684 | 154426 |
| 1320 | 154169 | 153911 | 153651 | 153391 | 153131 | 152869 | 152608 | 152345 |
| 1328 | 152082 | 151817 | 151553 | 151287 | 151022 | 150756 | 150489 | 150220 |
| 1336 | 149953 | 149683 | 149414 | 149144 | 148873 | 148601 | 148330 | 148057 |
| 1344 | 147784 | 147510 | 147235 | 146961 | 146685 | 146410 | 146132 | 145855 |
| 1352 | 145578 | 145299 | 145021 | 144741 | 144461 | 144181 | 143899 | 143618 |

APPENDIX-continued

| Address | +0 | +1 | +2 | +3 | +4 | +5 | +6 | +7 |
|---|---|---|---|---|---|---|---|---|
| 1360 | 143336 | 143053 | 142770 | 142488 | 142203 | 141917 | 141633 | 141347 |
| 1368 | 141062 | 140774 | 140487 | 140200 | 139913 | 139624 | 139334 | 139046 |
| 1376 | 138756 | 138466 | 138174 | 137883 | 137591 | 137300 | 137007 | 136714 |
| 1384 | 136421 | 136127 | 135832 | 135538 | 135242 | 134946 | 134651 | 134355 |
| 1392 | 134058 | 133761 | 133463 | 133166 | 132868 | 132569 | 132270 | 131970 |
| 1400 | 131670 | 131370 | 131070 | 130769 | 130469 | 130167 | 129864 | 129563 |
| 1408 | 129260 | 128957 | 128654 | 128351 | 128047 | 127743 | 127438 | 127134 |
| 1416 | 126830 | 126524 | 126218 | 125912 | 125607 | 125299 | 124994 | 124686 |
| 1424 | 124379 | 124071 | 123763 | 123455 | 123148 | 122839 | 122530 | 122220 |
| 1432 | 121912 | 121602 | 121292 | 120982 | 120672 | 120362 | 120051 | 119740 |
| 1440 | 119430 | 119119 | 118807 | 118496 | 118184 | 117871 | 117560 | 117247 |
| 1448 | 116935 | 116622 | 116310 | 115997 | 115684 | 115371 | 115056 | 114744 |
| 1456 | 114429 | 114116 | 113802 | 113488 | 113173 | 112859 | 112545 | 112230 |
| 1464 | 111915 | 111600 | 111286 | 110970 | 110656 | 110340 | 110026 | 109710 |
| 1472 | 109394 | 109078 | 108764 | 108448 | 108133 | 107817 | 107501 | 107185 |
| 1480 | 106870 | 106554 | 106238 | 105922 | 105607 | 105291 | 104975 | 104659 |
| 1488 | 104344 | 104026 | 103711 | 103395 | 103079 | 102763 | 102448 | 102132 |
| 1496 | 101816 | 101500 | 101185 | 100869 | 100553 | 100237 | 99921 | 99606 |
| 1504 | 99291 | 98976 | 98660 | 98346 | 98030 | 97715 | 97400 | 97085 |
| 1512 | 96771 | 96457 | 96142 | 95827 | 95512 | 95198 | 94885 | 94571 |
| 1520 | 94258 | 93943 | 93631 | 93318 | 93005 | 92692 | 92379 | 92066 |
| 1528 | 91753 | 91440 | 91129 | 90816 | 90504 | 90193 | 89881 | 89570 |
| 1536 | 89260 | 88948 | 88638 | 88328 | 88018 | 87708 | 87398 | 87090 |
| 1544 | 86780 | 86471 | 86162 | 85854 | 85545 | 85238 | 84931 | 84622 |
| 1552 | 84315 | 84009 | 83702 | 83396 | *83090 | 82785 | 82479 | 82175 |
| 1560 | 81869 | 81565 | 81260 | 80957 | 80653 | 80350 | 80047 | 79746 |
| 1568 | 79443 | 79141 | 78840 | 78538 | 78238 | 77937 | 77637 | 77338 |
| 1576 | 77038 | 76740 | 76441 | 76144 | 75845 | 75548 | 75251 | 74955 |
| 1584 | 74659 | 74364 | 74068 | 73772 | 73478 | 73185 | 72890 | 72598 |
| 1592 | 72305 | 72013 | 71720 | 71429 | 71139 | 70847 | 70557 | 70269 |
| 1600 | 69979 | 69690 | 69403 | 69114 | 68827 | 68541 | 68254 | 67968 |
| 1608 | 67683 | 67398 | 67114 | 66831 | 66547 | 66264 | 65982 | 65701 |
| 1616 | 65419 | 65138 | 64858 | 64579 | 64299 | 64021 | 63743 | 63466 |
| 1624 | 63189 | 62912 | 62636 | 62360 | 62086 | 61812 | 61539 | 61266 |
| 1632 | 60993 | 60720 | 60449 | 60179 | 59909 | 59639 | 59370 | 59101 |
| 1640 | 58833 | 58566 | 58300 | 58034 | 57768 | 57503 | 57238 | 56975 |
| 1648 | 56712 | 56450 | 56188 | 55927 | 55665 | 55405 | 55146 | 54888 |
| 1656 | 54629 | 54372 | 54115 | 53859 | 53603 | 53349 | 53095 | 52840 |
| 1664 | 52588 | 52336 | 52083 | 51832 | 51582 | 51333 | 51083 | 50834 |
| 1672 | 50587 | 50340 | 50094 | 49849 | 49603 | 49359 | 49114 | 48871 |
| 1680 | 48630 | 48388 | 48147 | 47905 | 47667 | 47428 | 47190 | 46951 |
| 1688 | 46715 | 46480 | 46244 | 46008 | 45774 | 45541 | 45308 | 45076 |
| 1696 | 44845 | 44614 | 44384 | 44155 | 43926 | 43699 | 43472 | 43245 |
| 1704 | 43019 | 42795 | 42570 | 42346 | 42123 | 41902 | 41680 | 41459 |
| 1712 | 41239 | 41020 | 40802 | 40583 | 40366 | 40150 | 39934 | 39719 |
| 1720 | 39504 | 39291 | 39078 | 38866 | 38654 | 38444 | 38234 | 38025 |
| 1728 | 37817 | 37608 | 37401 | 37195 | 36990 | 36785 | 36581 | 36377 |
| 1736 | 36174 | 35972 | 35771 | 35571 | 35371 | 35171 | 34972 | 34775 |
| 1744 | 34578 | 34382 | 34186 | 33992 | 33798 | 33603 | 33411 | 33219 |
| 1752 | 33028 | 32838 | 32648 | 32458 | 32270 | 32082 | 31895 | 31709 |
| 1760 | 31523 | 31339 | 31154 | 30970 | 30789 | 30606 | 30424 | 30244 |
| 1768 | 30064 | 29886 | 29707 | 29529 | 29351 | 29176 | 29000 | 28824 |
| 1776 | 28650 | 28476 | 28303 | 28131 | 27960 | 27788 | 27618 | 27450 |
| 1784 | 27280 | 27111 | 26944 | 26777 | 26611 | 26445 | 26281 | 26118 |
| 1792 | 25954 | 25791 | 25629 | 25468 | 25306 | 25146 | 24988 | 24829 |
| 1800 | 24671 | 24514 | 24358 | 24202 | 24046 | 23892 | 23738 | 23583 |
| 1808 | 23431 | 23279 | 23128 | 22976 | 22826 | 22678 | 22529 | 22380 |
| 1816 | 22233 | 22086 | 21939 | 21793 | 21649 | 21505 | 21362 | 21219 |
| 1824 | 21076 | 20933 | 20793 | 20653 | 20513 | 20373 | 20234 | 20096 |
| 1832 | 19959 | 19823 | 19687 | 19551 | 19416 | 19281 | 19148 | 19016 |
| 1840 | 18883 | 18751 | 18620 | 18490 | 18360 | 18230 | 18101 | 17974 |
| 1848 | 17845 | 17720 | 17593 | 17467 | 17342 | 17218 | 17094 | 16971 |
| 1856 | 16848 | 16725 | 16604 | 16484 | 16362 | 16244 | 16124 | 16005 |
| 1864 | 15888 | 15771 | 15654 | 15537 | 15421 | 15306 | 15192 | 15078 |
| 1872 | 14965 | 14852 | 14739 | 14628 | 14516 | 14406 | 14296 | 14186 |
| 1880 | 14078 | 13971 | 13862 | 13755 | 13648 | 13542 | 13436 | 13332 |
| 1888 | 13228 | 13123 | 13020 | 12918 | 12815 | 12713 | 12612 | 12512 |
| 1896 | 12412 | 12312 | 12213 | 12115 | 12016 | 11919 | 11822 | 11725 |
| 1904 | 11629 | 11535 | 11439 | 11344 | 11250 | 11157 | 11064 | 10972 |
| 1912 | 10880 | 10789 | 10697 | 10607 | 10517 | 10429 | 10340 | 10251 |
| 1920 | 10163 | 10076 | 9989 | 9903 | 9816 | 9731 | 9646 | 9561 |
| 1928 | 9477 | 9393 | 9310 | 9227 | 9146 | 9064 | 8983 | 8901 |
| 1936 | 8821 | 8741 | 8661 | 8583 | 8504 | 8427 | 8348 | 8271 |
| 1944 | 8194 | 8118 | 8043 | 7967 | 7893 | 7818 | 7744 | 7670 |
| 1952 | 7597 | 7524 | 7451 | 7380 | 7308 | 7237 | 7167 | 7097 |
| 1960 | 7027 | 6957 | 6888 | 6820 | 6751 | 6684 | 6617 | 6550 |
| 1968 | 6482 | 6417 | 6351 | 6287 | 6221 | 6157 | 6092 | 6029 |

APPENDIX-continued

| Address | +0 | +1 | +2 | +3 | +4 | +5 | +6 | +7 |
|---|---|---|---|---|---|---|---|---|
| 1976 | 5967 | 5904 | 5841 | 5779 | 5718 | 5657 | 5597 | 5537 |
| 1984 | 5476 | 5416 | 5358 | 5299 | 5241 | 5184 | 5126 | 5069 |
| 1992 | 5012 | 4956 | 4901 | 4845 | 4791 | 4735 | 4681 | 4628 |
| 2000 | 4574 | 4521 | 4469 | 4416 | 4365 | 4313 | 4262 | 4212 |
| 2008 | 4162 | 4112 | 4063 | 4013 | 3965 | 3918 | 3869 | 3822 |
| 2016 | 3775 | 3729 | 3683 | 3638 | 3592 | 3546 | 3502 | 3458 |
| 2024 | 3415 | 3370 | 3328 | 3285 | 3243 | 3202 | 3160 | 3119 |
| 2032 | 3078 | 3038 | 2998 | 2959 | 2919 | 2880 | 2842 | 2805 |
| 2040 | 2766 | 2729 | 2692 | 2656 | 2619 | 2583 | 2549 | 2513 |
| 2048 | 2479 | 2445 | 2410 | 2376 | 2343 | 2310 | 2277 | 2246 |
| 2056 | 2213 | 2182 | 2150 | 2119 | 2089 | 2059 | 2029 | 1999 |
| 2064 | 1969 | 1940 | 1912 | 1883 | 1855 | 1826 | 1799 | 1772 |
| 2072 | 1745 | 1717 | 1692 | 1665 | 1639 | 1613 | 1587 | 1563 |
| 2080 | 1537 | 1513 | 1489 | 1464 | 1440 | 1416 | 1393 | 1369 |
| 2088 | 1346 | 1323 | 1300 | 1279 | 1256 | 1234 | 1212 | 1190 |
| 2096 | 1169 | 1147 | 1126 | 1104 | 1084 | 1063 | 1043 | 1023 |
| 2104 | 1003 | 983 | 963 | 943 | 923 | 904 | 884 | 866 |
| 2112 | 847 | 827 | 809 | 790 | 772 | 753 | 736 | 717 |
| 2120 | 700 | 682 | 664 | 647 | 630 | 613 | 596 | 579 |
| 2128 | 562 | 546 | 529 | 513 | 497 | 480 | 464 | 449 |
| 2136 | 434 | 419 | 403 | 389 | 374 | 360 | 346 | 331 |
| 2144 | 317 | 303 | 290 | 277 | 264 | 251 | 239 | 227 |
| 2152 | 214 | 203 | 191 | 180 | 170 | 159 | 149 | 139 |
| 2160 | 130 | 120 | 111 | 103 | 94 | 87 | 79 | 71 |
| 2168 | 64 | 59 | 53 | 47 | 41 | 36 | 31 | 27 |
| 2176 | 23 | 19 | 16 | 16 | 16 | | | |

Output Word Rate = 15.017 Hz

| Address | +0 | +1 | +2 | +3 | +4 | +5 | +6 | +7 |
|---|---|---|---|---|---|---|---|---|
| 0 | 16 | 16 | 23 | 31 | 41 | 53 | 64 | 79 |
| 8 | 94 | 111 | 130 | 149 | 170 | 191 | 214 | 239 |
| 16 | 264 | 290 | 317 | 346 | 374 | 403 | 434 | 464 |
| 24 | 497 | 529 | 562 | 596 | 630 | 664 | 700 | 736 |
| 32 | 772 | 809 | 847 | 884 | 923 | 963 | 1003 | 1043 |
| 40 | 1084 | 1126 | 1169 | 1212 | 1256 | 1300 | 1346 | 1393 |
| 48 | 1440 | 1489 | 1537 | 1587 | 1639 | 1692 | 1745 | 1799 |
| 56 | 1855 | 1912 | 1969 | 2029 | 2089 | 2150 | 2213 | 2277 |
| 64 | 2343 | 2410 | 2479 | 2549 | 2619 | 2692 | 2766 | 2842 |
| 72 | 2919 | 2998 | 3078 | 3160 | 3243 | 3328 | 3415 | 3502 |
| 80 | 3592 | 3683 | 3775 | 3869 | 3965 | 4063 | 4162 | 4262 |
| 88 | 4365 | 4469 | 4574 | 4681 | 4791 | 4901 | 5012 | 5126 |
| 96 | 5241 | 5358 | 5476 | 5597 | 5718 | 5841 | 5967 | 6092 |
| 104 | 6221 | 6351 | 6482 | 6617 | 6751 | 6888 | 7027 | 7167 |
| 112 | 7308 | 7451 | 7597 | 7744 | 7893 | 8043 | 8194 | 8348 |
| 120 | 8504 | 8661 | 8821 | 8983 | 9146 | 9310 | 9477 | 9646 |
| 128 | 9816 | 9989 | 10163 | 10340 | 10517 | 10697 | 10880 | 11064 |
| 136 | 11250 | 11439 | 11629 | 11822 | 12016 | 12213 | 12412 | 12612 |
| 144 | 12815 | 13020 | 13228 | 13436 | 13648 | 13862 | 14078 | 14296 |
| 152 | 14516 | 14739 | 14965 | 15192 | 15421 | 15654 | 15888 | 16124 |
| 160 | 16362 | 16604 | 16848 | 17094 | 17342 | 17593 | 17845 | 18101 |
| 168 | 18360 | 18620 | 18883 | 19148 | 19416 | 19687 | 19959 | 20234 |
| 176 | 20513 | 20793 | 21076 | 21362 | 21649 | 21939 | 22233 | 22529 |
| 184 | 22826 | 23128 | 23430 | 23738 | 24046 | 24358 | 24671 | 24988 |
| 192 | 25306 | 25629 | 25954 | 26281 | 26611 | 26944 | 27280 | 27618 |
| 200 | 27960 | 28303 | 28650 | 29000 | 29351 | 29707 | 30064 | 30424 |
| 208 | 30789 | 31154 | 31523 | 31895 | 32270 | 32648 | 33028 | 33410 |
| 216 | 33798 | 34186 | 34578 | 34972 | 35371 | 35771 | 36174 | 36581 |
| 224 | 36990 | 37401 | 37817 | 38234 | 38654 | 39078 | 39504 | 39934 |
| 232 | 40366 | 40802 | 41239 | 41680 | 42123 | 42570 | 43019 | 43472 |
| 240 | 43926 | 44383 | 44845 | 45308 | 45774 | 46244 | 46715 | 47190 |
| 248 | 47667 | 48147 | 48630 | 49114 | 49603 | 50094 | 50587 | 51083 |
| 256 | 51582 | 52083 | 52588 | 53095 | 53603 | 54115 | 54629 | 55146 |
| 264 | 55665 | 56188 | 56712 | 57238 | 57768 | 58300 | 58833 | 59370 |
| 272 | 59909 | 60449 | 60993 | 61539 | 62086 | 62636 | 63189 | 63743 |
| 280 | 64299 | 64858 | 65419 | 65982 | 66547 | 67114 | 67683 | 68254 |
| 288 | 68827 | 69403 | 69979 | 70557 | 71139 | 71720 | 72305 | 72890 |
| 296 | 73478 | 74068 | 74659 | 75251 | 75845 | 76441 | 77038 | 77637 |
| 304 | 78238 | 78840 | 79443 | 80047 | 80653 | 81260 | 81869 | 82479 |
| 312 | 83090 | 83702 | 84315 | 84931 | 85545 | 86162 | 86780 | 87398 |
| 320 | 88018 | 88638 | 89260 | 89881 | 90504 | 91129 | 91753 | 92379 |
| 328 | 93005 | 93631 | 94258 | 94885 | 95512 | 96142 | 96771 | 97400 |
| 336 | 98036 | 98660 | 99291 | 99921 | 100553 | 101184 | 101816 | 102448 |
| 344 | 103079 | 103711 | 104343 | 104975 | 105607 | 106238 | 106870 | 107501 |
| 352 | 108133 | 108764 | 109394 | 110026 | 110656 | 111286 | 111915 | 112545 |
| 360 | 113173 | 113802 | 114429 | 115056 | 115684 | 116309 | 116935 | 117560 |
| 368 | 118184 | 118807 | 119430 | 120051 | 120672 | 121292 | 121912 | 122530 |
| 376 | 123148 | 123763 | 124379 | 124994 | 125607 | 126218 | 126830 | 127438 |
| 384 | 128047 | 128654 | 129260 | 129864 | 130469 | 131070 | 131670 | 132270 |

APPENDIX-continued

| Address | +0 | +1 | +2 | +3 | +4 | +5 | +6 | +7 |
|---|---|---|---|---|---|---|---|---|
| 392 | 132868 | 133463 | 134058 | 134651 | 135242 | 135832 | 136421 | 137007 |
| 400 | 137591 | 138174 | 138756 | 139334 | 139913 | 140487 | 141062 | 141633 |
| 408 | 142203 | 142770 | 143336 | 143899 | 144461 | 145021 | 145518 | 146132 |
| 416 | 146685 | 147235 | 147784 | 148330 | 148873 | 149414 | 149953 | 150489 |
| 424 | 151022 | 151553 | 152082 | 152608 | 153130 | 153651 | 154169 | 154684 |
| 432 | 155196 | 155705 | 156212 | 156717 | 157217 | 157715 | 158210 | 158701 |
| 440 | 159191 | 159677 | 160160 | 160639 | 161116 | 161589 | 162059 | 162526 |
| 448 | 162989 | 163449 | 163906 | 164359 | 164809 | 165256 | 165699 | 166138 |
| 456 | 166574 | 167005 | 167434 | 167860 | 168280 | 168698 | 169111 | 169521 |
| 464 | 169927 | 170329 | 170727 | 171122 | 171512 | 171897 | 172280 | 172658 |
| 472 | 173032 | 173402 | 173766 | 174128 | 174485 | 174838 | 175186 | 175531 |
| 480 | 175869 | 176205 | 176537 | 176862 | 177184 | 177501 | 177814 | 178123 |
| 488 | 178426 | 178726 | 179018 | 179308 | 179593 | 179873 | 180149 | 180419 |
| 496 | 180683 | 180944 | 181200 | 181450 | 181696 | 181936 | 182172 | 182403 |
| 504 | 182628 | 182849 | 183063 | 183273 | 183479 | 183679 | 183873 | 184062 |
| 512 | 184246 | 184425 | 184599 | 184766 | 184929 | 185088 | 185239 | 185387 |
| 520 | 185528 | 185664 | 185794 | 185919 | 186039 | 186154 | 186262 | 186365 |
| 528 | 186462 | 186555 | 186641 | 186722 | 186798 | 186868 | 186932 | 186991 |
| 536 | 187044 | 187092 | 187134 | 187171 | 187201 | 187227 | 187247 | 187260 |
| 544 | 187268 | 187271 | 187268 | 187260 | 187247 | 187227 | 187201 | 187171 |
| 552 | 187134 | 187092 | 187044 | 186991 | 186932 | 186868 | 186798 | 186722 |
| 560 | 186641 | 186555 | 186462 | 186365 | 186262 | 186154 | 186039 | 185919 |
| 568 | 185794 | 185664 | 185528 | 185387 | 185239 | 185088 | 184929 | 184766 |
| 576 | 184599 | 184425 | 184246 | 184062 | 183873 | 183679 | 183479 | 183273 |
| 584 | 183063 | 182849 | 182628 | 182403 | 182172 | 181936 | 181696 | 181450 |
| 592 | 181200 | 180944 | 180683 | 180419 | 180149 | 179873 | 179593 | 179308 |
| 600 | 179018 | 178726 | 178426 | 178123 | 177814 | 177501 | 177184 | 176862 |
| 608 | 176537 | 176205 | 175869 | 175531 | 175186 | 174838 | 174485 | 174128 |
| 616 | 173766 | 173402 | 173032 | 172658 | 172280 | 171897 | 171512 | 171122 |
| 624 | 170727 | 170329 | 169927 | 169521 | 169111 | 168698 | 168280 | 167860 |
| 632 | 167434 | 167005 | 166574 | 166138 | 165699 | 165256 | 164809 | 164359 |
| 640 | 163906 | 163449 | 162989 | 162526 | 162059 | 161589 | 161116 | 160639 |
| 648 | 160160 | 159677 | 159191 | 158701 | 158210 | 157715 | 157217 | 156717 |
| 656 | 156212 | 155705 | 155196 | 154684 | 154169 | 153651 | 153130 | 152608 |
| 664 | 152082 | 151553 | 151022 | 150489 | 149953 | 149414 | 148873 | 148330 |
| 672 | 147784 | 147235 | 146685 | 146132 | 145578 | 145021 | 144461 | 143899 |
| 680 | 143336 | 142770 | 142203 | 141633 | 141062 | 140487 | 139913 | 139334 |
| 688 | 138756 | 138174 | 137591 | 137007 | 136421 | 135832 | 135242 | 134651 |
| 696 | 134058 | 133463 | 132868 | 132270 | 131670 | 131070 | 130469 | 129864 |
| 704 | 129260 | 128654 | 128047 | 127438 | 126830 | 126218 | 125607 | 124994 |
| 712 | 124379 | 123763 | 123148 | 122530 | 121912 | 121292 | 120672 | 120051 |
| 720 | 119430 | 118807 | 118184 | 117560 | 116935 | 116309 | 115684 | 115056 |
| 728 | 114429 | 113802 | 113173 | 112545 | 111915 | 111286 | 110656 | 110026 |
| 736 | 109394 | 108764 | 108133 | 107501 | 106870 | 106238 | 105607 | 104975 |
| 744 | 104343 | 103711 | 103079 | 102448 | 101816 | 101184 | 100553 | 99921 |
| 752 | 99291 | 98660 | 98030 | 97400 | 96771 | 96142 | 95512 | 94885 |
| 760 | 94258 | 93631 | 93005 | 92379 | 91753 | 91129 | 90504 | 89881 |
| 768 | 89260 | 88638 | 88018 | 87398 | 86780 | 86162 | 85545 | 84931 |
| 776 | 84315 | 83702 | 83090 | 82479 | 81869 | 81260 | 80653 | 80047 |
| 784 | 79443 | 78840 | 78238 | 77637 | 77038 | 76441 | 75845 | 75251 |
| 792 | 74659 | 74068 | 73478 | 72890 | 72305 | 71720 | 71139 | 70557 |
| 800 | 69979 | 69403 | 68827 | 68254 | 67683 | 67114 | 66547 | 65982 |
| 808 | 65419 | 64858 | 64299 | 63743 | 63189 | 62636 | 62086 | 61539 |
| 816 | 60993 | 60449 | 59909 | 59370 | 58833 | 58300 | 57768 | 57238 |
| 824 | 56712 | 56188 | 55665 | 55146 | 54629 | 54115 | 53603 | 53095 |
| 832 | 52588 | 52083 | 51582 | 51083 | 50587 | 50094 | 49603 | 49114 |
| 840 | 48630 | 48147 | 47667 | 47190 | 46715 | 46244 | 45774 | 45308 |
| 848 | 44845 | 44383 | 43926 | 43472 | 43019 | 42570 | 42123 | 41680 |
| 856 | 41239 | 40802 | 40366 | 39934 | 39504 | 39078 | 38654 | 38234 |
| 864 | 37817 | 37401 | 36990 | 36581 | 36174 | 35771 | 35371 | 34972 |
| 872 | 34578 | 34186 | 33798 | 33410 | 33028 | 32648 | 32270 | 31895 |
| 880 | 31523 | 31154 | 30789 | 30424 | 30064 | 29707 | 29351 | 29000 |
| 888 | 28650 | 28303 | 27960 | 27618 | 27280 | 26944 | 26611 | 26281 |
| 896 | 2594 | 25629 | 25306 | 24988 | 24671 | 24358 | 240746 | 23738 |
| 904 | 23430 | 23128 | 22826 | 22529 | 22233 | 21939 | 21649 | 21362 |
| 912 | 21076 | 20793 | 20513 | 20234 | 19959 | 19687 | 19416 | 19148 |
| 920 | 18883 | 18620 | 18360 | 18101 | 17845 | 17593 | 17342 | 17094 |
| 928 | 16848 | 16604 | 16362 | 16124 | 15888 | 15654 | 15421 | 15192 |
| 936 | 14965 | 14739 | 14516 | 14296 | 14078 | 13862 | 13648 | 13436 |
| 944 | 13228 | 13020 | 12815 | 12612 | 12412 | 12213 | 12016 | 11822 |
| 952 | 11629 | 11439 | 11250 | 11064 | 10880 | 10697 | 10517 | 10340 |
| 960 | 10163 | 9989 | 9816 | 9646 | 9477 | 9310 | 9146 | 8983 |
| 968 | 8821 | 8661 | 8504 | 8348 | 8194 | 8043 | 7893 | 7744 |
| 976 | 7597 | 7451 | 7308 | 7167 | 7027 | 6888 | 6751 | 6617 |
| 984 | 6482 | 6351 | 6221 | 6092 | 5967 | 5841 | 5718 | 5597 |
| 992 | 5476 | 5358 | 5241 | 5126 | 5012 | 4901 | 4791 | 4681 |
| 1000 | 4574 | 4469 | 4365 | 4262 | 4162 | 4063 | 3965 | 3869 |

APPENDIX-continued

| Address | +0 | +1 | +2 | +3 | +4 | +5 | +6 | +7 |
|---|---|---|---|---|---|---|---|---|
| 1008 | 3775 | 3683 | 3592 | 3502 | 3415 | 3328 | 3243 | 3160 |
| 1016 | 3078 | 2998 | 2919 | 2842 | 2766 | 2692 | 2619 | 2549 |
| 1024 | 2479 | 2410 | 2343 | 2277 | 2213 | 2150 | 2089 | 2029 |
| 1032 | 1969 | 1912 | 1855 | 1799 | 1745 | 1692 | 1639 | 1587 |
| 1040 | 1537 | 1489 | 1440 | 1393 | 1346 | 1300 | 1256 | 1212 |
| 1048 | 1169 | 1126 | 1084 | 1043 | 1003 | 963 | 923 | 884 |
| 1056 | 847 | 809 | 772 | 736 | 700 | 664 | 630 | 596 |
| 1064 | 562 | 529 | 497 | 464 | 434 | 403 | 374 | 346 |
| 1072 | 317 | 290 | 264 | 239 | 214 | 191 | 170 | 149 |
| 1080 | 130 | 111 | 94 | 79 | 64 | 53 | 41 | 31 |
| 1088 | 23 | 16 | 16 | | | | | |

Output Word Rate = 30.062 Hz

| Address | +0 | +1 | +2 | +3 | +4 | +5 | +6 | +7 |
|---|---|---|---|---|---|---|---|---|
| 0 | 16 | 31 | 53 | 79 | 111 | 149 | 191 | 239 |
| 8 | 290 | 346 | 403 | 464 | 529 | 596 | 664 | 736 |
| 16 | 809 | 884 | 963 | 1043 | 1126 | 1212 | 1300 | 1393 |
| 24 | 1489 | 1587 | 1692 | 1799 | 1912 | 2029 | 2150 | 2277 |
| 32 | 2410 | 2549 | 2692 | 2842 | 2998 | 3160 | 3328 | 3502 |
| 40 | 3683 | 3869 | 4063 | 4262 | 4469 | 4681 | 4901 | 5126 |
| 48 | 5358 | 5597 | 5841 | 6092 | 6351 | 6617 | 6888 | 7167 |
| 56 | 7451 | 7744 | 8043 | 8348 | 8661 | 8983 | 9310 | 9646 |
| 64 | 9989 | 10340 | 10697 | 11064 | 11439 | 11822 | 12213 | 12612 |
| 72 | 13020 | 13436 | 13862 | 14296 | 14739 | 15192 | 15654 | 16124 |
| 80 | 16604 | 17094 | 17593 | 18101 | 18620 | 19148 | 19687 | 20234 |
| 88 | 20793 | 21362 | 21939 | 22529 | 23128 | 23738 | 24358 | 24988 |
| 96 | 25629 | 26281 | 26944 | 27618 | 28303 | 29000 | 29707 | 30424 |
| 104 | 31154 | 31895 | 32648 | 33411 | 34186 | 34972 | 35711 | 36581 |
| 112 | 37401 | 38234 | 39078 | 39934 | 40802 | 41680 | 42580 | 43472 |
| 120 | 44384 | 45308 | 46244 | 47190 | 48147 | 49114 | 50094 | 51083 |
| 128 | 52083 | 53095 | 54115 | 55147 | 56188 | 57238 | 58300 | 59370 |
| 136 | 60449 | 61539 | 62636 | 63743 | 64858 | 65982 | 67114 | 68254 |
| 144 | 69403 | 70557 | 71720 | 72891 | 74068 | 75251 | 76441 | 77637 |
| 152 | 78840 | 80047 | 81260 | 82479 | 83702 | 84931 | 86162 | 87398 |
| 160 | 88638 | 89882 | 91129 | 92379 | 93631 | 94885 | 96142 | 97400 |
| 168 | 98660 | 99922 | 101185 | 102448 | 103711 | 104975 | 106238 | 107501 |
| 176 | 108764 | 110026 | 111286 | 112545 | 113802 | 115057 | 116310 | 117560 |
| 184 | 118807 | 120052 | 121292 | 122531 | 123764 | 124994 | 126218 | 127438 |
| 192 | 128654 | 129864 | 131070 | 132270 | 133464 | 134651 | 135832 | 137007 |
| 200 | 138174 | 139334 | 140487 | 141633 | 142771 | 143899 | 145021 | 146132 |
| 208 | 147236 | 148330 | 149414 | 150489 | 151553 | 152608 | 153651 | 154684 |
| 216 | 155705 | 156717 | 157716 | 158701 | 159677 | 160639 | 161589 | 162526 |
| 224 | 163449 | 164359 | 165257 | 166138 | 167005 | 167860 | 168699 | 169522 |
| 232 | 170329 | 171122 | 171898 | 172658 | 173402 | 174128 | 174838 | 175531 |
| 240 | 176205 | 176863 | 177501 | 178123 | 178726 | 179309 | 179873 | 180419 |
| 248 | 180945 | 181450 | 181936 | 182403 | 182849 | 183274 | 183679 | 184062 |
| 256 | 184425 | 184767 | 185088 | 185387 | 185664 | 185920 | 186154 | 186365 |
| 264 | 186555 | 186723 | 186868 | 186991 | 187093 | 187171 | 187227 | 187260 |
| 272 | 187271 | 187260 | 187227 | 187171 | 187093 | 186991 | 186868 | 186723 |
| 280 | 186555 | 186365 | 186154 | 185920 | 185664 | 185387 | 185088 | 184767 |
| 288 | 184425 | 184062 | 183679 | 183274 | 182849 | 182403 | 181936 | 181450 |
| 296 | 180945 | 180419 | 179873 | 179309 | 178726 | 178123 | 177501 | 176863 |
| 304 | 176205 | 175531 | 174838 | 174128 | 173402 | 172658 | 171898 | 171122 |
| 312 | 170329 | 169522 | 168699 | 167860 | 167005 | 166138 | 165257 | 164359 |
| 320 | 163449 | 162526 | 161589 | 160639 | 159677 | 158701 | 157716 | 156717 |
| 328 | 155705 | 154684 | 153651 | 152608 | 151553 | 150489 | 149414 | 148330 |
| 336 | 147236 | 146132 | 145021 | 143899 | 142771 | 141633 | 140487 | 139334 |
| 344 | 138174 | 137007 | 135832 | 134651 | 133464 | 132270 | 131070 | 129864 |
| 352 | 128654 | 127438 | 126218 | 124994 | 123764 | 122531 | 121292 | 120052 |
| 360 | 118807 | 117560 | 116310 | 115057 | 113802 | 112545 | 111286 | 110026 |
| 368 | 108764 | 107501 | 106238 | 104975 | 103711 | 102448 | 101185 | 99922 |
| 376 | 98660 | 97400 | 96142 | 94885 | 93631 | 92379 | 91129 | 89882 |
| 384 | 88638 | 87398 | 86162 | 84931 | 83702 | 82479 | 81260 | 80047 |
| 392 | 78840 | 77637 | 76441 | 75251 | 74068 | 72891 | 71720 | 70557 |
| 400 | 69403 | 68251 | 67114 | 65982 | 64858 | 63743 | 62636 | 61539 |
| 408 | 60449 | 59370 | 58300 | 57238 | 56188 | 55147 | 54115 | 53095 |
| 416 | 52083 | 51083 | 50094 | 49114 | 48147 | 47190 | 46244 | 45308 |
| 424 | 44384 | 43472 | 42570 | 41680 | 40802 | 39934 | 39078 | 38234 |
| 432 | 37401 | 36581 | 35771 | 34972 | 34186 | 33411 | 32648 | 31895 |
| 440 | 31154 | 30424 | 29707 | 29000 | 28303 | 27618 | 26944 | 26281 |
| 448 | 25629 | 24988 | 24358 | 23738 | 23128 | 22529 | 21939 | 21362 |
| 456 | 20793 | 20234 | 19687 | 19148 | 18620 | 18101 | 17593 | 17094 |
| 464 | 16604 | 16124 | 15654 | 15192 | 14739 | 14296 | 13862 | 13436 |
| 472 | 13020 | 12612 | 12213 | 11822 | 11439 | 11064 | 10697 | 10340 |
| 480 | 9989 | 9646 | 9310 | 8983 | 8661 | 8348 | 8043 | 7744 |
| 488 | 7451 | 7167 | 6888 | 6617 | 6351 | 6092 | 5841 | 5597 |
| 496 | 5358 | 5126 | 4901 | 4681 | 4469 | 4262 | 4063 | 3869 |
| 504 | 3683 | 3502 | 3328 | 3160 | 2998 | 2842 | 2692 | 2549 |

APPENDIX-continued

| Address | +0 | +1 | +2 | +3 | +4 | +5 | +6 | +7 |
|---|---|---|---|---|---|---|---|---|
| 512 | 2410 | 2277 | 2150 | 2029 | 1912 | 1799 | 1692 | 1587 |
| 520 | 1489 | 1393 | 1300 | 1212 | 1126 | 1043 | 963 | 884 |
| 528 | 809 | 736 | 664 | 596 | 529 | 464 | 403 | 346 |
| 536 | 290 | 239 | 191 | 149 | 111 | 79 | 53 | 31 |
| 544 | 16 | | | | | | | |
| | | | Output Word Rate = 60.015 Hz | | | | | |
| 0 | 16 | 53 | 111 | 191 | 290 | 403 | 529 | 664 |
| 8 | 809 | 963 | 1126 | 1300 | 1489 | 1692 | 1912 | 2150 |
| 16 | 2410 | 2692 | 2998 | 3328 | 3683 | 4063 | 4469 | 4901 |
| 24 | 5358 | 5841 | 6351 | 6888 | 7451 | 8043 | 8661 | 9310 |
| 32 | 9988 | 10697 | 11439 | 12213 | 13020 | 13862 | 14739 | 15654 |
| 40 | 16604 | 17592 | 18620 | 19687 | 20793 | 21939 | 23127 | 24358 |
| 48 | 25629 | 26944 | 28302 | 29707 | 31154 | 32647 | 34186 | 35770 |
| 56 | 37401 | 39078 | 40801 | 42580 | 44383 | 46243 | 48146 | 50094 |
| 64 | 52083 | 54114 | 56188 | 58299 | 60448 | 62636 | 64857 | 67113 |
| 72 | 69402 | 71720 | 74067 | 76440 | 78839 | 81259 | 83701 | 86162 |
| 80 | 88638 | 91128 | 93630 | 96141 | 98659 | 101184 | 103710 | 106237 |
| 88 | 108763 | 111285 | 113801 | 116308 | 118806 | 121290 | 123762 | 126217 |
| 96 | 128653 | 131069 | 133462 | 135831 | 138173 | 140486 | 142769 | 145019 |
| 104 | 147234 | 149413 | 151552 | 153649 | 155704 | 157714 | 159676 | 161587 |
| 121 | 163448 | 165255 | 167004 | 168697 | 170327 | 171896 | 173400 | 174836 |
| 120 | 176204 | 177499 | 178724 | 179871 | 180943 | 181934 | 182847 | 183677 |
| 128 | 184423 | 185086 | 185662 | 186152 | 186553 | 186866 | 187091 | 187225 |
| 136 | 187269 | 187225 | 187091 | 186866 | 186553 | 186152 | 185662 | 185086 |
| 144 | 184423 | 183677 | 182847 | 181934 | 180943 | 179871 | 178724 | 177499 |
| 152 | 176204 | 174836 | 173400 | 171896 | 170327 | 168697 | 167004 | 165255 |
| 160 | 163448 | 161587 | 159676 | 157714 | 155704 | 153649 | 151552 | 149413 |
| 168 | 147234 | 145019 | 142769 | 140486 | 138173 | 135831 | 133462 | 131069 |
| 176 | 128653 | 126217 | 123762 | 121290 | 118806 | 116308 | 113801 | 111285 |
| 184 | 108763 | 106237 | 103710 | 101184 | 98659 | 96141 | 93630 | 91128 |
| 192 | 88638 | 86162 | 83701 | 81259 | 78839 | 76440 | 74067 | 71720 |
| 200 | 69402 | 67113 | 64857 | 62636 | 60448 | 58299 | 56188 | 54114 |
| 208 | 52083 | 50094 | 48146 | 46243 | 44383 | 42570 | 40801 | 39078 |
| 216 | 37401 | 35770 | 34186 | 32647 | 31154 | 29707 | 28302 | 26944 |
| 224 | 25629 | 24358 | 23127 | 21939 | 20793 | 19687 | 18620 | 17592 |
| 232 | 16604 | 15654 | 14739 | 13862 | 13020 | 12213 | 11439 | 10697 |
| 240 | 9988 | 9310 | 8661 | 8043 | 7451 | 6888 | 6351 | 5841 |
| 248 | 5358 | 4901 | 4469 | 4063 | 3683 | 3328 | 2998 | 2692 |
| 256 | 2410 | 2150 | 1912 | 1692 | 1489 | 1300 | 1126 | 963 |
| 264 | 809 | 664 | 529 | 403 | 290 | 191 | 111 | 53 |
| 272 | 16 | | | | | | | |
| | | | Output Word Rate = 128.188 Hz | | | | | |
| 0 | 16 | 111 | 299 | 554 | 853 | 1194 | 1585 | 2045 |
| 8 | 2592 | 3237 | 3990 | 4855 | 5834 | 6927 | 8140 | 9473 |
| 16 | 10939 | 12544 | 14296 | 16204 | 18274 | 20513 | 22929 | 25524 |
| 24 | 28309 | 31284 | 34457 | 37831 | 41407 | 45184 | 49159 | 53326 |
| 32 | 57678 | 62201 | 66889 | 71723 | 76692 | 81774 | 86955 | 92214 |
| 40 | 97532 | 102888 | 108262 | 113633 | 118983 | 124291 | 129539 | 134708 |
| 48 | 139782 | 144739 | 149561 | 154231 | 158729 | 163037 | 167133 | 171001 |
| 56 | 174618 | 177966 | 181027 | 183778 | 186205 | 188288 | 190015 | 191372 |
| 64 | 192349 | 192938 | 193134 | 192938 | 192349 | 191372 | 190015 | 188288 |
| 72 | 186205 | 183778 | 181027 | 177966 | 174618 | 171001 | 167133 | 163037 |
| 80 | 158729 | 154231 | 149561 | 144739 | 139782 | 134708 | 129539 | 124291 |
| 88 | 118983 | 113633 | 108262 | 102888 | 97532 | 92214 | 86955 | 81774 |
| 96 | 76692 | 71723 | 66889 | 62201 | 57678 | 53326 | 49159 | 45184 |
| 104 | 41407 | 37831 | 34457 | 31284 | 28309 | 25524 | 22929 | 20513 |
| 112 | 18274 | 16204 | 14296 | 12544 | 10939 | 9473 | 8140 | 6927 |
| 120 | 5834 | 4855 | 3990 | 3237 | 2592 | 2045 | 1585 | 1194 |
| 128 | 853 | 554 | 299 | 111 | 16 | | | |
| | | | Output Word Rate = 168.907 Hz | | | | | |
| 0 | 37 | 190 | 431 | 726 | 1081 | 1523 | 2081 | 2771 |
| 8 | 3605 | 4582 | 5709 | 6994 | 8450 | 10091 | 11934 | 13987 |
| 16 | 16263 | 18771 | 21522 | 24523 | 27779 | 31292 | 35054 | 39052 |
| 24 | 43274 | 47695 | 52293 | 57036 | 61895 | 66833 | 71819 | 76816 |
| 32 | 81789 | 86706 | 91534 | 96240 | 100794 | 105163 | 109313 | 113214 |
| 40 | 116829 | 120125 | 123069 | 125628 | 127769 | 129466 | 130695 | 131440 |
| 48 | 131690 | 131440 | 130695 | 129466 | 127769 | 125628 | 123069 | 120125 |
| 56 | 116829 | 113214 | 109313 | 105163 | 100794 | 96240 | 91534 | 86706 |
| 64 | 81789 | 76816 | 71819 | 66833 | 61895 | 57036 | 52293 | 47695 |
| 72 | 43274 | 39052 | 35054 | 31292 | 27779 | 24523 | 21522 | 18771 |
| 80 | 16263 | 13987 | 11934 | 10091 | 8450 | 6994 | 5709 | 4582 |
| 88 | 3605 | 2771 | 2081 | 1523 | 1081 | 726 | 431 | 190 |
| 96 | 37 | | | | | | | |

APPENDIX-continued

| Address | +0 | +1 | +2 | +3 | +4 | +5 | +6 | +7 |
|---|---|---|---|---|---|---|---|---|
| Output Word Rate = 202.272 Hz | | | | | | | | |
| 0 | 45 | 280 | 652 | 1117 | 1713 | 2499 | 3515 | 4777 |
| 8 | 6292 | 8074 | 10147 | 12542 | 15286 | 18404 | 21917 | 25846 |
| 16 | 30208 | 35011 | 40254 | 45916 | 51968 | 58366 | 65057 | 71982 |
| 24 | 79069 | 86248 | 93447 | 100593 | 107619 | 114459 | 121045 | 127311 |
| 32 | 133188 | 138608 | 143500 | 147795 | 151423 | 154320 | 156431 | 157716 |
| 40 | 158147 | 157716 | 156431 | 154320 | 151423 | 147795 | 143500 | 138608 |
| 48 | 133188 | 127311 | 121045 | 114459 | 107619 | 100593 | 93447 | 86248 |
| 56 | 76069 | 71982 | 65057 | 58366 | 51968 | 45916 | 40254 | 35011 |
| 64 | 30208 | 25846 | 21917 | 18404 | 15286 | 12542 | 10147 | 8074 |
| 72 | 6292 | 4777 | 3515 | 2499 | 1713 | 1117 | 652 | 280 |
| 80 | 45 | | | | | | | |

What is claimed is:

1. A method of reducing the power consumption of an analog-to-digital converter digital filter comprising:
   providing a digital data stream to said digital filter, said digital data being a function of an analog voltage or current level provided to said converter; and
   selectively activating at least a portion of said digital filter in response to a condition of said digital data stream.

2. The method of claim 1, said condition being a predetermined digital value.

3. The method of claim 2, said selectively activating step further comprising disabling or enabling said portion of said digital filter for at least some of the occurrences of said condition.

4. The method of claim 3, said portion of said digital filter being at least a data storage structure.

5. The method of claim 4, said selectively activating step further comprising disabling or enabling said data storage structure for at least some occurrences of said condition.

6. The method of claim 5 wherein said data storage structure may be a filter coefficient storage device or a register.

7. The method of claim 1, said selectively activating step further comprising enabling or disabling said portion of said digital filter for a portion of a period in which said digital data stream is provided to said filter.

8. A digital filter for an analog-to-digital converter, comprising:
   a serial data stream input, said input receiving serial data to be filtered by said digital filter;
   a control signal path, an input to said control signal path being said serial data stream input;
   a data signal path, said data signal path having an output for providing a filtered output of said digital filter; and
   control signals provided from said control signal path to said data signal path, said control signals selectively enabling at least a portion of said data signal path as a function of the condition of said serial data.

9. The digital filter of claim 8, said serial data being provided only to said control signal path.

10. The digital filter of claim 9, said data signal path comprising a filter coefficient storage device, said storage device being selectively enabled.

11. The digital filter of claim 10, said data signal path further comprising a register, said register being selectively enabled.

12. The digital filter of claim 11, said storage device being a filter coefficient ROM and said register being an accumulator register.

13. A method for operating a digital filter, comprising:
   providing said digital filter;
   providing a serial digital data stream to said filter; and
   selectively disabling or selectively enabling at least a portion of said digital filter for at least some occurrences of a predetermined condition of said digital data.

14. The method of claim 13, said predetermined condition being a digital logic state.

15. The method of claim 14, said digital logic state being a function of a plurality of bits of said digital data stream.

16. The method of claim 14, said digital logic state being a digital 1 state or a digital 0 state.

17. The method of claim 13, said digital filter including a memory storage device, said selectively disabling or enabling step further comprising disabling or enabling said memory storage device.

18. The method of claim 17, said memory storage device being a coefficient ROM.

19. The method of claim 13, said digital filter including a data storage device, said selectively disabling or enabling step further comprising disabling or enabling said memory storage device.

20. The method of claim 19, said selectively disabling or enabling occurring for each occurrence of said predetermined condition.

21. The method of claim 13, said selectively disabling or enabling occurring for each occurrence of said predetermined condition.

22. The method of claim 13, said digital filter including an accumulator, said selectively disabling or enabling step further comprising disabling or enabling said accumulator.

23. The method of claim 13, said memory storage device being a coefficient ROM.

24. The method of claim 13, said digital filter including an accumulator, said selectively disabling or enabling step further comprising disabling or enabling said accumulator.

25. A method of reducing the power consumption of a digital filter, said digital filter filtering a serial input digital data stream of an analog-to-digital converter and providing a filtered output, said method comprising:
   providing a data signal path of said filter, said data signal path having a plurality of circuits and a digital filter output;
   providing a control signal path of said filter, said control signal path providing control signals for operating at least a portion of said data signal path circuits;
   providing said input digital data stream to said control signal path of said filter; and
   selectively disabling or enabling at least one of said circuits with said control signals in response to logic values of said serial input digital data stream.

26. The method of claim 25, said selectively disabling or enabling conditioned upon said serial digital data stream.

27. The method of claim 26, said at least one disabled or enabled circuits including a filter coefficient storage device.

28. The method of claim 25, said input digital data stream being only provided to said control signal path.

29. The method of claim 28, said at least one of said circuits including a filter coefficient storage device.

30. The method of claim 25, said control signals selectively operating at least one of said circuits in response to a detected condition of said input digital data stream.

31. The method of claim 30, said selective operation further comprising enabling or disabling at least one of said circuits in response to detecting a predetermined digital state, said state being at least one digital bit of said digital data stream.

32. A digital filter within an analog-to-digital converter, comprising:

an input, said input receiving a data input stream to said digital filter;

at least one enable control signal, said enable control signal being a function of data in said data input stream; and a plurality of filter circuit components within said digital filter, at least one of said circuit components being connected to said enable control signal such that said at least one circuit component may be enabled or disabled as a function of said data in said data input stream.

33. The digital filter of claim 32, said at least one circuit component being selectively enabled or disabled for as a function of whether said data is a logical 1 or logical 0.

34. The digital filter of claim 33, said at least one circuit component being a filter coefficient ROM.

35. The digital filter of claim 32, wherein said at least one circuit component is a filter coefficient storage device.

36. A low power analog-to-digital converter digital filter, comprising:

a controller;

a serial data bit stream input connected to said controller;

a coefficient ROM, said ROM receiving enable and coefficient address signals from said controller, said enable signal being a function of input data provided to said input; and a storage device coupled to said coefficient ROM, said storage device having a multi-bit output.

37. The filter of claim 36, said enable signal selectively enabling or disabling said coefficient ROM as a function of whether said input data is a logical 1 or a logical 0.

38. The filter of claim 36, said storage device being an accumulator register, said register connected to said enable signal.

39. A method for operating an analog-to-digital converter, comprising: providing a digital filter, said digital filter including a coefficient ROM or an accumulator;

providing an input serial digital data stream to said filter, said data being a serial stream of 0's and 1's digital logic values; and disabling or enabling said coefficient ROM or said accumulator in response to detecting a predetermined one of said digital logic values in said input serial data stream.

* * * * *

UNITED STATES PATENT AND TRADEMARK OFFICE
CERTIFICATE OF CORRECTION

PATENT NO.: 5,923,273
DATED: July 13, 1999
INVENTOR(S): Pastorello

It is certified that error(s) appear in the above-identified patent and that said Letters Patent is hereby corrected as shown below:

In claim 19, Column 40, line 39, delete 'memory" and insert --data--.

In claim 23, column 40, line 48, after claim, delete "13" and insert --20--.

In claim 23, Column 40, line 48, delete "memory" and insert --data--.

Signed and Sealed this

Thirteenth Day of February, 2001

Attest:

NICHOLAS P. GODICI

*Attesting Officer*   *Acting Director of the United States Patent and Trademark Office*